United States Patent [19]
Takeguchi

[11] Patent Number: 5,400,276
[45] Date of Patent: Mar. 21, 1995

[54] ELECTRICALLY ERASABLE NONVOLATILE SEMICONDUCTOR MEMORY THAT PERMITS DATA READOUT DESPITE THE OCCURRENCE OF OVER-ERASED MEMORY CELLS

[75] Inventor: Tetsuji Takeguchi, Kawasaki, Japan
[73] Assignee: Fujitsu Limited, Kanagawa, Japan
[21] Appl. No.: 181,533
[22] Filed: Jan. 14, 1994

[30] Foreign Application Priority Data

Mar. 17, 1993 [JP] Japan .................................. 5-057381
Jun. 2, 1993 [JP] Japan .................................. 5-132050

[51] Int. Cl.$^6$ ........................................... G11C 11/24
[52] U.S. Cl. .................... 365/149; 365/226; 365/900
[58] Field of Search ............... 365/189.01, 149, 182, 365/213, 226, 227, 900

[56] References Cited

U.S. PATENT DOCUMENTS 5,136,533 8/1992 Harari ............................... 365/149

FOREIGN PATENT DOCUMENTS 5-198190 8/1993 Japan .

Primary Examiner—Terrell W. Fears
Attorney, Agent, or Firm—Nikaido, Marmelstein, Murray & Oram

[57] ABSTRACT

The purpose of the present invention is to provide an electrically erasable nonvolatile semiconductor memory that permits correct data readout despite the occurrence of over-erased memory cells. In the nonvolatile semiconductor memory of the invention, a select transistor whose gate is connected to a word line is provided for each group consisting of a plurality of memory cells, and the sources of the memory cells in the same group are connected to a common source via the select transistor. For writing and erasure, the source-drain relationship is reversed from that previously practiced, so that for writing the drain is grounded and a positive voltage is applied to the source while for erasure the source is grounded and a high voltage is applied to the drain. In a nonvolatile semiconductor memory according to another mode of the invention, a source line is provided independently for every one or a plurality of word lines. For reading, the source line, word line, and bit line to which the memory cell selected for reading is connected are supplied with a lower supply voltage, a higher supply voltage, and a positive voltage lower than the higher supply voltage, respectively, while the source lines and word lines to which the selected memory cell is not connected are supplied with the higher supply voltage and the lower supply voltage, respectively, and the bit lines to which the selected memory cell is not connected are opened.

20 Claims, 20 Drawing Sheets

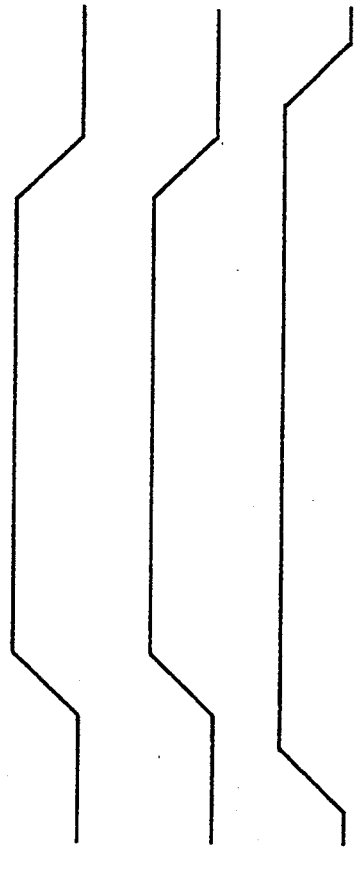
Fig.23A COMMON SOURCE LINE
Fig.23B DESELECTED BIT LINE
Fig.23C WORD LINE
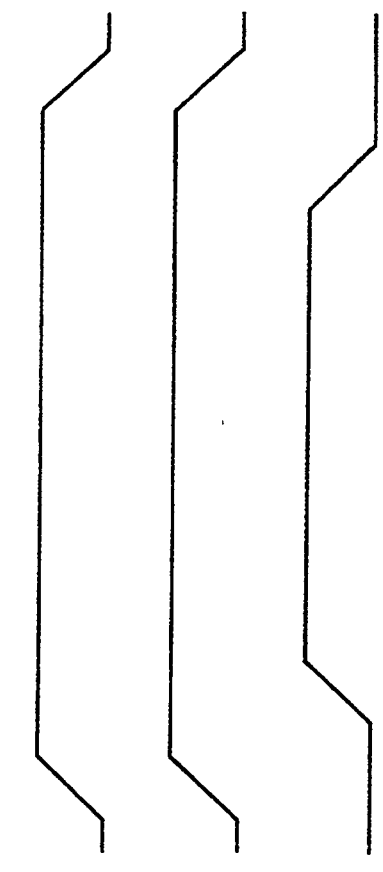
Fig.24A COMMON SOURCE LINE
Fig.24B DESELECTED BIT LINE
Fig.24C WORD LINE

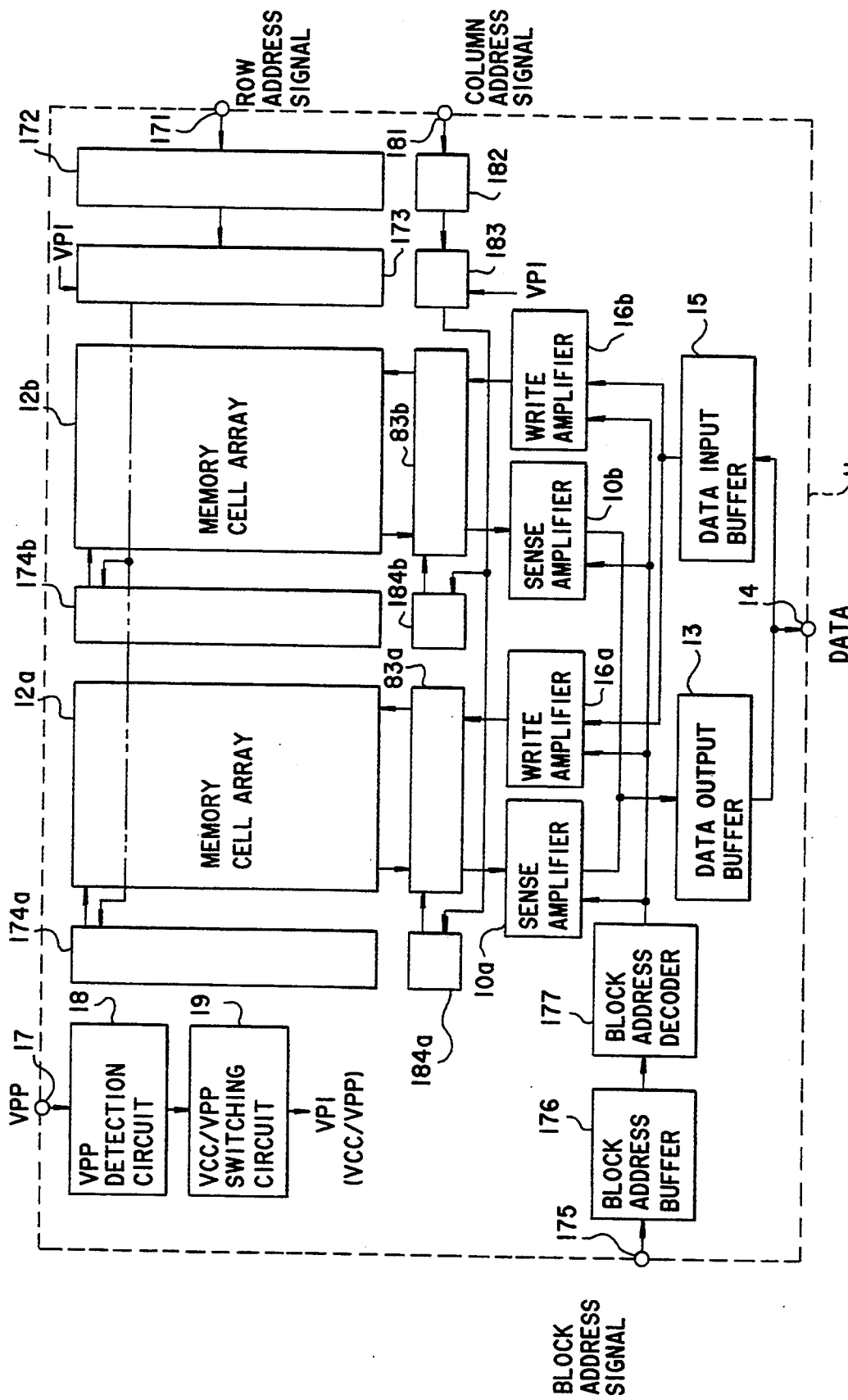

ELECTRICALLY ERASABLE NONVOLATILE SEMICONDUCTOR MEMORY THAT PERMITS DATA READOUT DESPITE THE OCCURRENCE OF OVER-ERASED MEMORY CELLS

BACKGROUND OF THE INVENTION

1. Field of the Invention

The present invention relates to a nonvolatile semiconductor memory, generally known as a flash memory, whose contents are electrically erasable in total or in part, and more particularly to a flash memory wherein provisions are made to ensure correct data readout despite the occurrence of over-erased memory cells.

2. Description of the Related Art

In the semiconductor memory field, vigorous development work has been under way in recent years to develop devices with cell configurations that can achieve a lower per-bit cost and that permit device miniaturization for increased memory capacity. The intention behind this is to replace magnetic storage media with semiconductor memories. At the present time, the cell structure that can achieve the goals of increased capacity and decreased cost is the one-transistor-per-cell structure having one floating gate (FG) per cell, as employed for EPROMs, and a memory generally known as a flash memory is a typical example of a memory device having such a cell structure.

A flash memory comprises a matrix array of memory cells each constructed with a transistor having a two-layered gate structure consisting of a control gate and a floating gate. Storage is achieved by utilizing the property that when prescribed voltages are applied to the control gate, drain, and source, the current flowing between the drain and source varies according to whether or not charge is stored on the floating gate. In flash memory, injecting charge into the floating gate is generally called writing.

In flash memory, reading and writing are performed by selecting a particular transistor and applying prescribed voltages to the control gate, drain, and source of the selected transistor. On the other hand, erasure is performed on one memory cell block at a time or on a plurality of memory cell blocks together, each block consisting of memory cells connected to the same common source line. Therefore, the state after erasure varies depending on variations in the characteristics of the memory cells selected for erasure and also on whether data was already written in these memory cells. In particular, if electrons are overextracted from the floating gate FG of any memory cell, the floating gate will be put in the positive state; this causes the problem of over-erasure which interferes with correct data readout because leakage current flows into the bit line connected to the memory cell even when the memory cell is in the deselect state.

Previous approaches to the elimination of such over-erasure problem have been made, for example, by reducing variations in the memory cell characteristics during manufacture, or by writing data into all the memory cells prior to erasure. Tightening up tolerances for allowable variations in the memory cell characteristics in the manufacturing process, however, introduces a problem in that the manufacturing yield decreases. Accordingly, there is a demand to provide a flash memory that can ensure correct data readout despite the occurrence of over-erased memory cells.

To reduce the effect of over-erasure, there has been proposed a configuration in which a source select transistor is added whose gate input is coupled to the same word line as the memory cell selected. In such a flash memory configuration, source lines are arranged in parallel to the word lines, one source line for every one or more than one word line, and the source lines are connected to a common source line, each via a diode and the select transistor whose control gate is connected to the word line. With this configuration, for reading, only the source line connected to the memory cell selected for reading is grounded, and the other source lines are opened. This arrangement therefore ensures correct data readout because over-erased memory cells, if connected to the same bit line, do not affect the reading.

Such a flash memory configuration, however, requires the provision of a diode via which to apply a high voltage to the source line for erasure, so that a larger spacing has to be provided between the word lines than in the structure that does not require the provision of such a diode. This not only makes it difficult to achieve a higher integration but introduces a problem in that extra steps have to be added to the wafer fabrication process in order to form such diodes.

In semiconductor memories, in order to improve the fabrication yield, redundant memory cells are included which are switched in to replace defective memory cells. The replacement of defective memory cells is usually done on a bit line or word line basis.

Such redundant design is also employed for flash memories; however, when the replacement is done on a word line basis, problems that do not occur in DRAMs and SRAMs arise in the case of flash memories since erasure is also done on a row that contains replaced defective memory cells. There can be various causes for failure. For example, when a failure is caused by a word line shorting to a source line or a device ground line, in a DRAM or SRAM such a word line should only be replaced by a redundant word line. In a flash memory, on the other hand, an erasure operation is performed by applying a high voltage to the source line in the selected source block while connecting all the word lines in the block to ground. In the case of the above failure, however, since the word lines are grounded, the memory cells connected to the replaced word line are also subjected to the same erasure conditions. However, no write operations are performed on the memory cells connected to the replaced word lines, which means that these memory cells will no doubt be put in an over-erased state after several erase operations. Since the replaced memory cells remain connected to the bit lines after the replacement, the normal memory cells cannot be read out correctly if the replaced memory cells are in an over-erased state. In other failure causes also, since the replaced memory cells are subjected to conditions close to the erasure conditions, there is a strong possibility that these memory cells will gradually be put into an over-erased state. For these reasons, in flash memories, it has not been possible to effect redundancy replacement on a word line basis.

Which of the bit line replacement or word line replacement is appropriate is usually determined in connection with the manufacturing process. In the case of flash memories, however, since the replacement cannot be done on a word line basis, redundancy replacement has always been effected on a bit line basis even in cases where the word line replacement would be more appropriate. It is therefore demanded to provide a flash memory that permits redundancy replacement on a word line basis so that the appropriate redundancy configuration can be selected.

SUMMARY OF THE INVENTION

It is an object of the present invention to provide a nonvolatile semiconductor memory that permits correct data readout despite the occurrence of over-erased memory cells. Specifically, the invention being directed to the provision of a nonvolatile semiconductor memory in which, in order to reduce the effect of over-erasure, a select transistor whose gate is connected to a word line is provided for each memory cell group consisting of a plurality of memory cells and the sources of the memory cells in the same group are connected to a common source via the select transistor, it is a first object of the invention to realize a device structure which eliminates the need for a diode via which to apply an erasure voltage to the source during erasure, thereby achieving increased memory density and simplified fabrication process, and which is suitable for writing and reading in the memory of such a configuration. It is a second object of the invention to provide a nonvolatile semiconductor memory of an alternative structure that permits correct data readout despite the occurrence of over-erased memory cells.

According to a first mode of the invention, which accomplishes the first object, there is provided a nonvolatile semiconductor memory in which in order to reduce the effect of over-erasure, a select transistor whose gate is connected to a word line is provided for each memory cell group consisting of a plurality of memory cells and the sources of the memory cells in the same group are connected to a common source via the select transistor, wherein a diode via which to supply an erasure voltage is eliminated, and in write and erasure operations, the drain-source relationship is reversed from that previously practiced, so that, for writing, the drain is grounded and a positive voltage is applied to the source, while for erasure the source is grounded and a high voltage is applied to the drain.

With the above configuration, source lines are separated from each other, and during reading, only the source line connected to the memory cell selected for reading is grounded; therefore, if there are over-erased memory cells, such memory cells do not affect reading. For writing and erasure, the drain-source relationship is reversed from that previously practiced, so that there is no need to provide a diode, as required previously, to drive the source line to a high voltage for erasure. As a result, there is no need to apply a high voltage to the source, which permits elimination of such a diode and thus contributes to increasing the memory density and simplifying the fabrication process.

Basically, the memory cell has a symmetrical structure between source and drain so that either can be used as the source or drain. It is therefore possible to set the source open and apply a high voltage to the drain for erasure, or conversely, to set the drain open and apply a positive voltage to the source for writing. The source and drain in the memory cell are basically interchangeable in this manner, but in reality, as will be detailed later, the electrode to which a positive voltage is applied during writing is so structured as to enhance the generation of hot carriers to improve the writing efficiency, and the electrode to which a high voltage is applied during erasure is so structured as to provide increased breakdown strength. In the prior art nonvolatile semiconductor memory, therefore, a first electrode (the source) connected to a common source line is provided with such a structure as to provide increased breakdown strength, and a second electrode (the drain) connected to the bit line is provided with such a structure that enhances the generation of hot carriers. On the other hand, in the present invention, since the high voltage for erasure is applied to the second electrode (the drain), the second electrode (the drain) needs to be structured so as to sustain the high voltage. However, since increasing the breakdown strength and enhancing the generation of hot carriers are contradictory demands, the second electrode (the drain) cannot be so configured as to enhance the generation of hot carriers. In the present invention, therefore, the first electrode (the source) has the structure that enhances the generation of hot carriers, and for writing, the relationship between the electrodes is reversed so that the positive voltage is applied to the first electrode (the source).

To accomplish the second object, in a nonvolatile semiconductor memory according to a second mode of the invention, a source line is provided independently for every one or a plurality of word lines. For reading, the source line, word line, and bit line to which the memory cell selected for reading is connected are supplied with a lower supply voltage, a higher supply voltage, and a positive voltage lower than the higher supply voltage, respectively, while the source lines and word lines to which the selected memory cell is not connected are supplied with the higher supply voltage and the lower supply voltage, respectively, and the bit lines to which the selected memory cell is not connected are either opened or driven to the lower supply voltage.

In the nonvolatile semiconductor memory according to the second mode of the invention, to accomplish a read operation, a positive voltage lower than the higher supply voltage is applied to the drain of the selected memory cell, the lower supply voltage is applied to the source, and the higher supply voltage is applied to the control gate, the memory cell is thus prepared for reading.

On the other hand, for the memory cells sharing the same bit line with the selected memory cell, a positive voltage lower than the higher supply voltage is applied to their drains, the higher supply voltage is applied to their sources, and the lower supply voltage is applied to their control gates. Thus, the memory cells sharing the same bit line with the selected memory cell are placed into conditions that make them more difficult to turn on than in the prior art configuration. As a result, if there are over-erased memory cells among the deselected memory cells sharing the same bit line with the selected memory cell, leakage currents from such over-erased memory cells are suppressed.

BRIEF DESCRIPTION OF THE DRAWINGS

The present invention will be more clearly understood from the description as set forth below with reference to the accompanying drawings, wherein:

FIG. 23 is a diagram showing an example of write timing according to the seventh embodiment;

FIG. 24 is a diagram showing an example of write timing according to the seventh embodiment;

FIG. 25 is a block diagram showing the general configuration of a nonvolatile semiconductor memory according to an eighth embodiment of the present invention;

DESCRIPTION OF THE PREFERRED EMBODIMENTS

Before proceeding to a detailed description of the preferred embodiments of the present invention, prior art flash memories will be described below for a clearer understanding of the differences between the present invention and the prior art.

Figure 1:
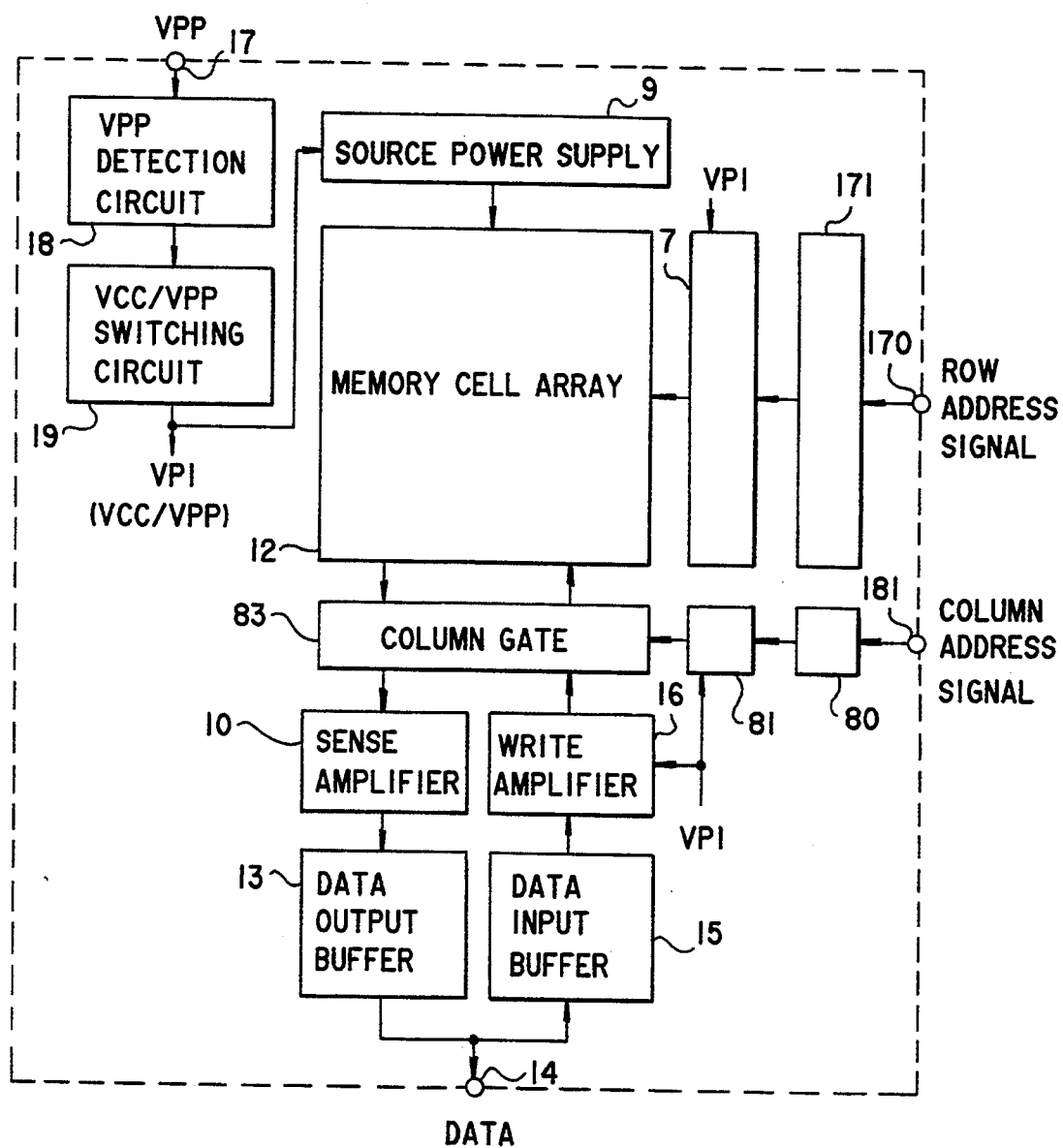
FIG. 1 is a general block diagram showing the basic configuration of a prior art nonvolatile semiconductor memory.

FIG. 1 is a block diagram showing the basic configuration of a prior art flash memory. The flash memory subsumed under the present invention has the same basic configuration as the illustrated one. Throughout the drawings, the same functional parts are designated by the same reference numerals.

In FIG. 1, the reference numeral 11 is a chip, 12 is a memory cell array consisting of memory cell transistors arranged in a matrix form, 9 is a source power supply circuit for outputting a voltage which is applied to the sources of the memory cell transistors, 170 is a row address signal input terminal, 171 is a row address buffer which latches a row address signal input via the row address signal input terminal 170, and 7 is a row decoder for selecting a word line in the memory cell array 12 by decoding an internal row address signal fed from the row address buffer 171. Further, the numeral 181 is a column address signal input terminal, 80 is a column address buffer which latches a column address signal input via the column address signal input terminal 181, 81 is a column decoder which decodes an internal column address signal fed from the column address buffer 80 and outputs a column select signal necessary for the selection of a column (bit line) in the memory cell array 12.

Furthermore, the reference numeral 83 is a column gate for selecting a column in the memory cell array 12 in accordance with the column select signal fed from the column decoder 81, 10 is a sense amplifier for amplifying data read out of the memory cell array 12, 13 is a data output buffer through which the data amplified by the sense amplifier 10 is output to the outside, 14 is a data input/output terminal, 15 is a data input buffer which latches write data input via the data input/output terminal 14, 16 is a write amplifier for writing the write data latched by the data input buffer 15 into the memory cell array, 17 is a VPP input terminal at which a high voltage VPP, for example, 12 V, is input for erasure and writing, 18 is a VPP detection circuit for detecting the high voltage VPP input at the VPP input terminal 17, and 19 is a VCC/VPP switching circuit which outputs a supply voltage VCC, for example, 5 V, as a voltage VPI when no high voltage VPP is detected by the VPP detection circuit 18, and which outputs the high voltage VPP as the voltage VPI when the high voltage VPP is detected by the VPP detection circuit 18.

Figure 2:
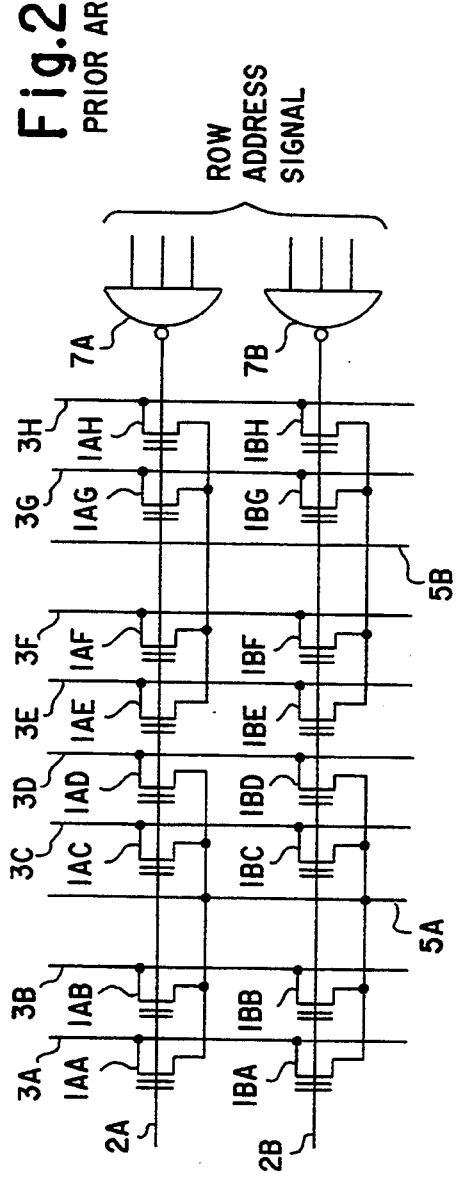
FIG. 2 is a circuit diagram showing portions in detail of a memory cell array and a row decoder in the prior art semiconductor memory.

FIG. 2 is a diagram showing in more detail a portion of the memory cell array 12 and row decoder 7 of a prior art flash memory.

In FIG. 2, the reference numerals 1AA to 1AH and 1BA to 1BH are memory cell transistors, 2A and 2B are word lines, 3A to 3H are bit lines, 5A and 5B are common source lines, and 7A and 7B are NAND circuits constituting the row decoder 7.

Figure 3:
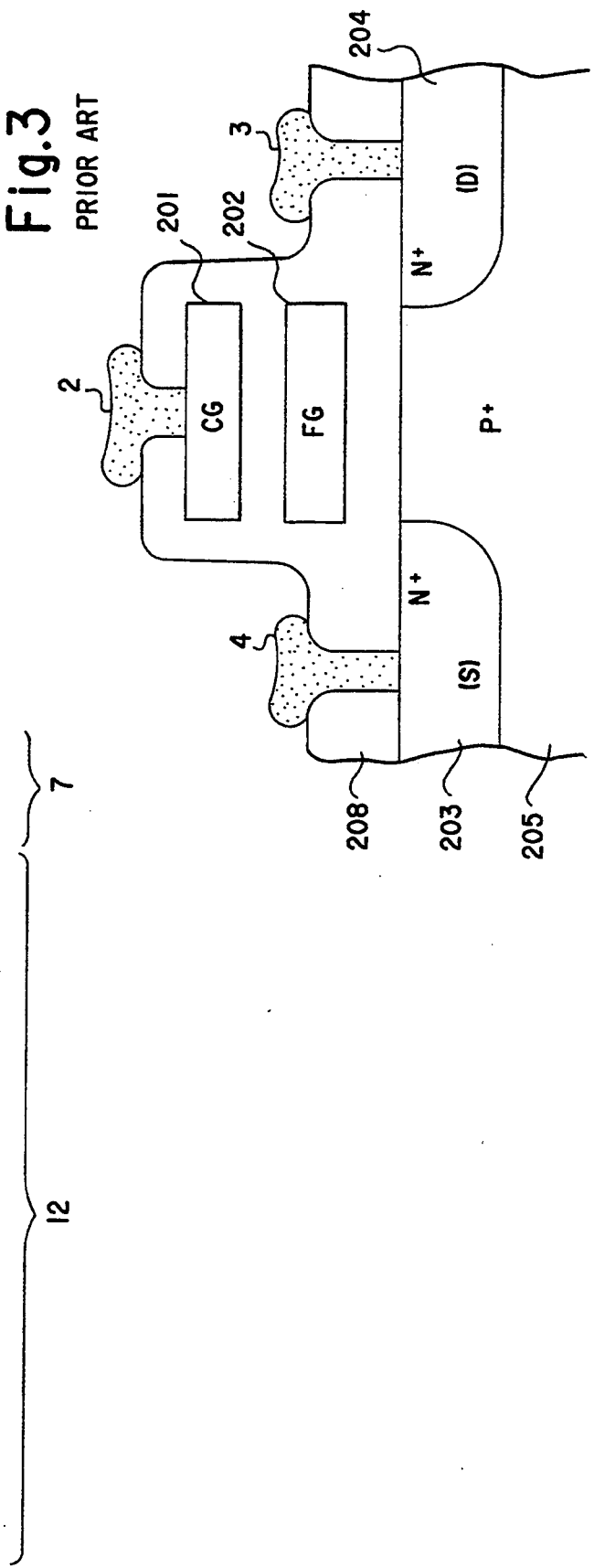
FIG. 3 is a diagram showing the structure of a nonvolatile semiconductor memory.

FIG. 3 is a diagram showing a typical example of a cell structure for the memory cell transistor of FIG. 2.

In FIG. 3, the reference numeral 201 is a control electrode (control gate CG), 202 is a floating gate (FG), 203 is a source (S), 204 is a drain (D), and 205 is a substrate (base) which is covered with an oxide film 208. The numeral 2 is a word line connected to the control gate 201, 4 is a common source line connected to the source 203, and 3 is a bit line connected to the drain 204. Interposed between the floating gate 202 and the base 205 is the tunnel oxide film.

Figure 4A:
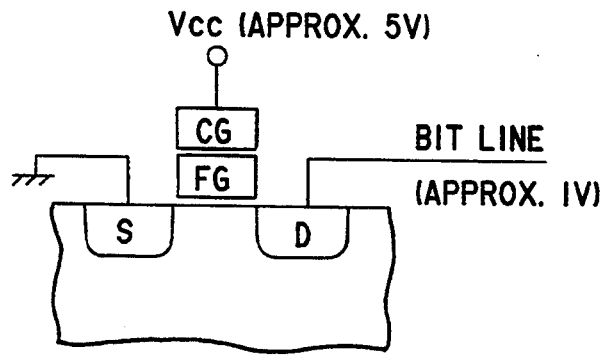
FIGS. 4A to 4C are diagrams for explaining read, write, and erasure methods for a flash memory.
Figure 4B:
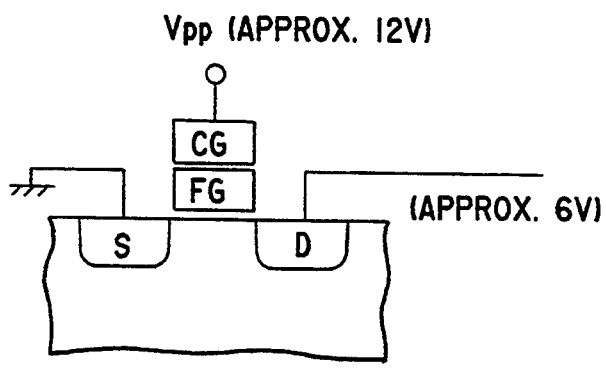
Figure 4C:
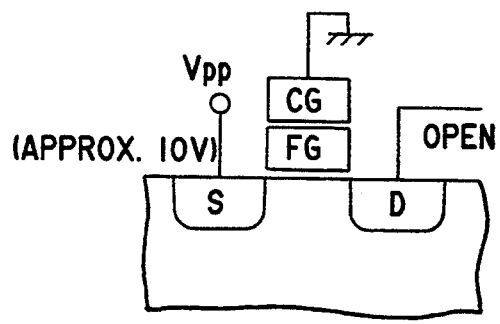

FIGS. 4A to 4C are diagrams for explaining read, write, and erasure methods for the flash memory: FIG. 4A is for reading, FIG. 4B for writing, and FIG. 4C for erasure.

For reading, a voltage of about 0 V is applied to the source, a voltage of about 1 V is applied to the drain (bit line), and a voltage of about 5 V is applied to the control gate (word line), as shown in FIG. 4A, and the sense amplifier detects whether or not current flows through the bit line, thereby accomplishing a read operation. For writing, a voltage of about 0 V is applied to the source S, a voltage of about 6 V is applied to the drain D, and a voltage of about 12 V is applied to the control gate CG, as shown in FIG. 4B; this causes avalanche breakdown near the drain and hot electrons generated by the avalanche breakdown are injected into the floating gate FG, thus accomplishing a write operation. For erasure, a voltage of about 10 V is applied to the source S, the drain D is opened, and 0 V is applied to the control gate CG, as shown in FIG. 4C; this produces a high electric field between the floating gate FG and the source S, which causes electrons on the floating gate FG to flow into the source S by the Fowler-Nordheim tunneling effect.

The source is connected to a common line. The memory cells are divided into blocks each consisting of memory cells connected to the same common source line, and erasure is performed on one block at a time or on a plurality of blocks together. That is, erasure occurs for all cells in the same block or blocks simultaneously. In this specification, the source and drain electrodes are named according to the drain-source relationship determined by the read conditions and, for convenience sake, the thus determined electrode names are also used for the write and erase operations. For example, the electrode connected to the bit line will always be referred to as the drain irrespective of the operating mode.

Since erasure is performed simultaneously on all the memory cells connected to the same common source line, as noted above, the state after erasure varies depending on variations in the characteristics of the memory cell transistors selected for erasure and also on whether data are already written in these memory cells. In particular, if electrons are over-extracted from the floating gate FG of any memory cell by the erasure operation, the floating gate will be put in the positive state; this causes the problem of over-erasure which interferes with correct data readout because leakage current flows into the bit line connected to the memory cell even when the memory cell is in the deselect state. To simplify the explanation, reference is made to FIG. 5 which illustrates how the erased state changes by the data written in the memory cell selected for erasure.

Figure 5:
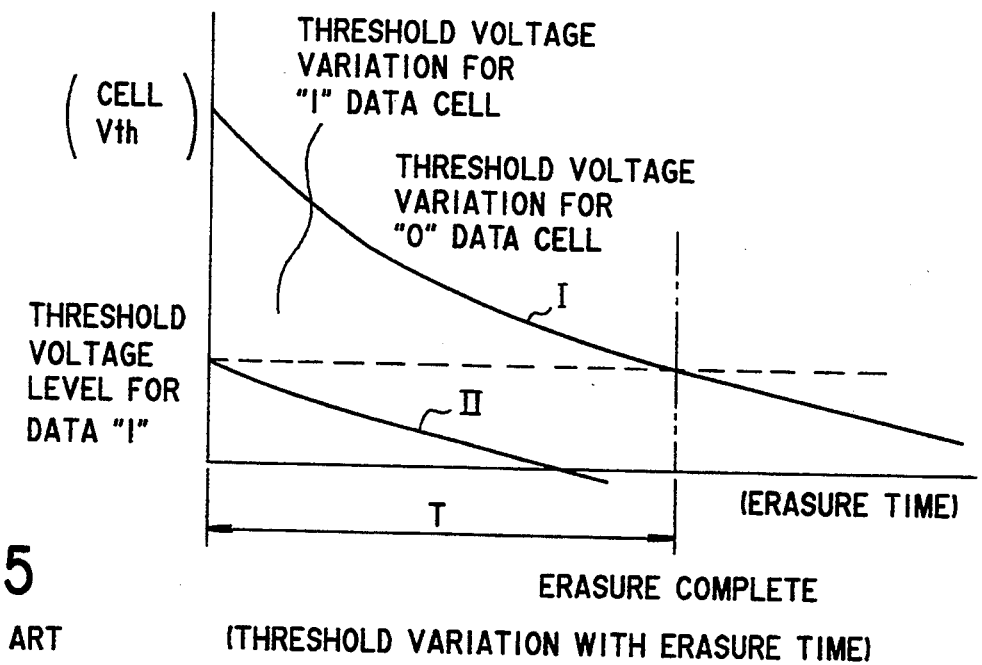
FIG. 5 is a diagram for explaining over-erasure in a flash memory.

Generally, data "0" is made to correspond to the written state, i.e., the state in which excess electrons are stored on the floating gate FG, and data "1" is made to correspond to the state in which no excess electrons are stored on the floating gate FG. Therefore, the threshold voltage at which a memory cell is turned on for reading is higher for a memory cell storing "0" than for a memory cell storing "1"; therefore, when reading is performed by applying the voltage indicated in FIG. 4, the memory cell storing "1" is turned on, causing a current to flow into the bit line, but the memory cell storing "0" remains off so that no current flow occurs on the bit line. Erasure means reducing the threshold voltage Vth of all memory cells to the level corresponding to the data "1", that is, reducing the threshold voltage Vth of "0" data memory cells to the level corresponding to the data "1". During erasure the threshold voltage Vth of the "0" data memory cell changes as shown in FIG. 5, but at the same time, the threshold voltage Vth of the "1" data memory cell drops further below the level corresponding to the data "1". If this threshold voltage drops to a voltage level at which the memory cell is turned on even when the read voltage (5 V) is not applied to its control gate CG, the memory cell is put in an over-erased state, where correct data readout cannot be accomplished because of the leakage current occurring on the bit line connected to that memory cell even when that memory cell is in the deselect state.

The above description has dealt with a case in which the data written in the memory cells to be erased are different from each other. On the other hand, if there are variations in the transistor characteristics because of manufacturing variations, the change of the threshold voltage Vth shown in FIG. 5 will differ between memory cell transistors. In this case, if the threshold voltage Vth of the memory cell exhibiting the slowest change is to be reduced below the erasure level, the other memory cell transistors may be put in the over-erased state.

In reality, however, it is rare that any memory cell transistor is erased into such an over-erased state as to cause a large leakage current by itself, but when many memory cells are connected to the same bit line, the leakage current from each memory cell, if very small, may amount to a large leakage current, when combined, and correct data readout may not be accomplished.

Figure 6:
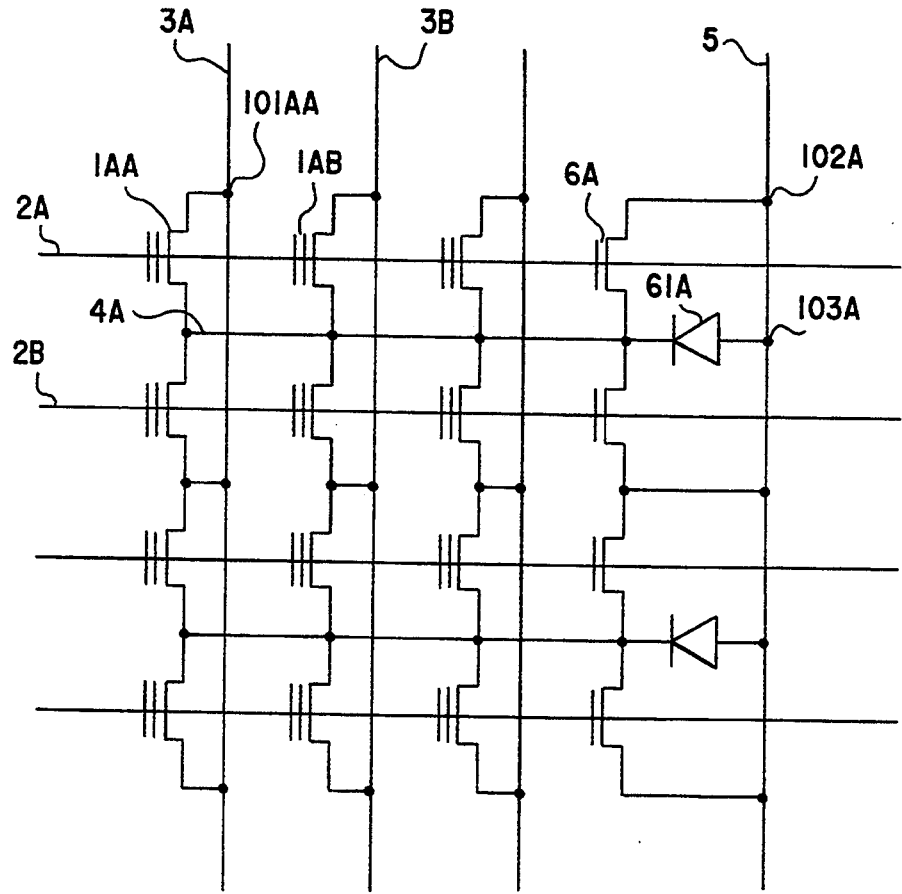
FIG. 6 is a diagram showing a prior art flash memory configuration designed to reduce the effects of over-erased cells.

To reduce the effect of such over-erasure, there has been proposed a configuration in which a source select transistor is added whose gate input is coupled to the same word line as the memory cell selected. FIG. 6 is a diagram showing this prior art configuration.

In the flash memory having the configuration of FIG. 6, 1AA, 1AB, ..., are memory cells, 2A is a word line, 3A is a bit line, 4A is a common source line, 5 is a common source, 6A is the select transistor, and 61A is a diode. Voltages from the row decoder and column decoder are applied to the selected word line and bit line in accordance with the operating mode and the location of the memory cell to be accessed, and a prescribed voltage is applied to the common source 5 from the common source control section in accordance with the operating mode. In FIG. 6, the common source line 4A is provided, in common, to two rows of memory cells, but such a common source line may be provided for each row. The select transistor 6A should be provided for each group of memory cells arranged in the same row, and the number of memory cells in each group may be determined as required.

Suppose here that the memory cell 1AA is to be accessed. For reading, about 5 V is applied to the word line 2A, about 1 V is applied to the bit line 3A, and 0 V is applied to the common source 5. Since about 5 V, which is on the word line 2A, is applied to the gate of the select transistor 6A, the select transistor 6A is ON, while the source of the memory cell 1AA is held at 0 V as 0 V is applied to the common source line 4A, thus performing the read operation with the same conditions as shown in FIG. 4A. Since the word lines other than the word line 2A are held at 0 V, the select transistors other than the one indicated at 6A remain off, so that all the common source lines except the one indicated at 4A are open. As a result, if there are over-erased memory cells connected to the bit line 3A, except the memory cell adjacent to the memory cell 1AA, no leakage current flows into the bit line and correct data readout can be accomplished.

For writing, about 12 V is applied to the word line 12A, about 6 V is applied to the bit line 3A, and 0 V is applied to the common source 5. Thus, as for reading, the select transistor for the row containing the memory cell to be accessed is turned on, so that the memory cell is subjected to the same voltage conditions as shown in FIG. 4B. For erasure, 0 V is applied to all the word lines 2A and about 12 V is applied to the common source 5, while all the bit lines are opened. The voltage of about 12 V on the common source 5 is applied to each common source line 4A via its associated diode, so that the same erasure voltage as shown in FIG. 4C is applied to each memory cell. With the configuration of FIG. 6, since the erasure voltage of about 12 V cannot be applied to each common source line via the select transistor, the diode as shown needs to be provided between the common source 5 and each common source line.

Figure 7:
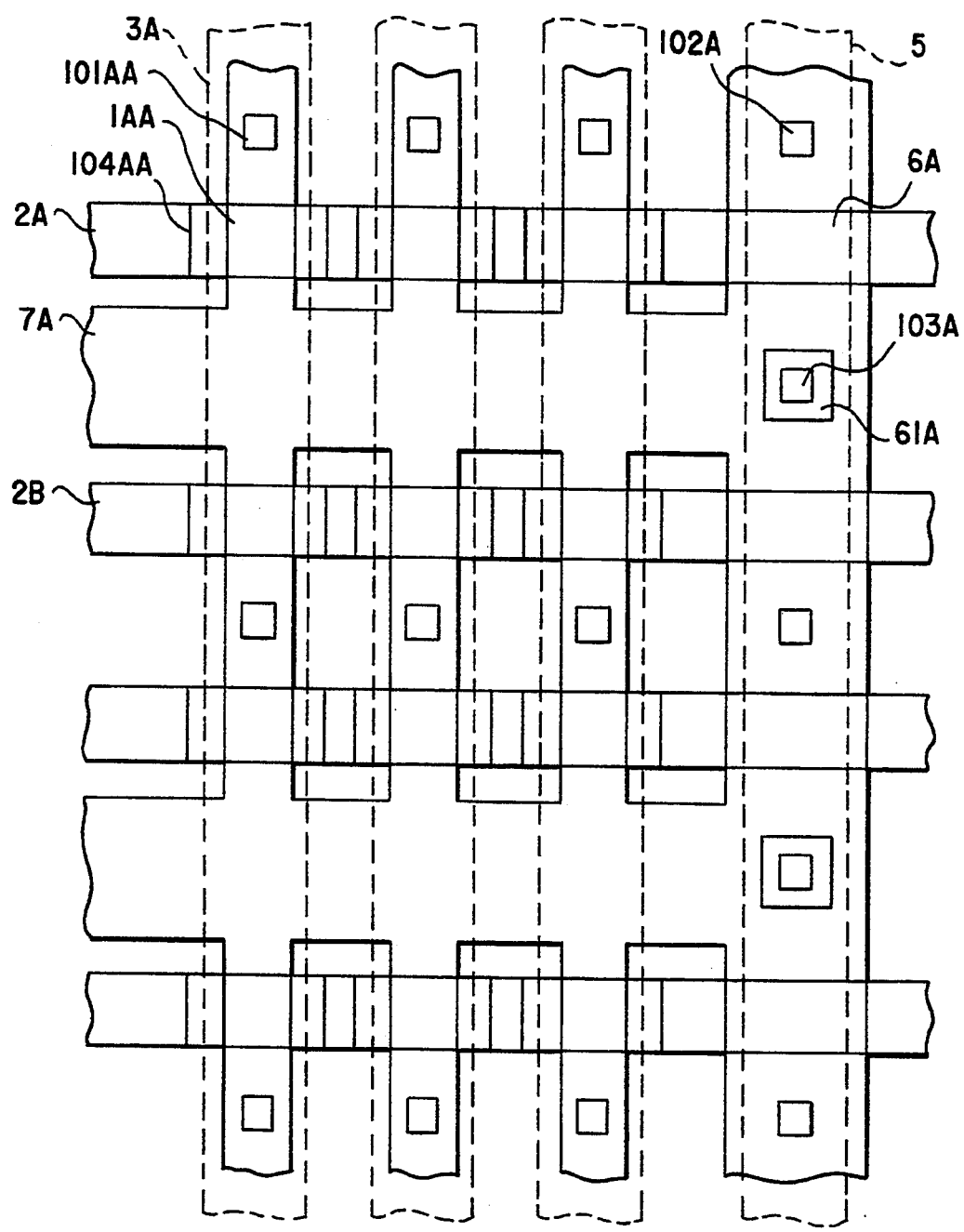
FIG. 7 is a top plan view showing a device arrangement in the circuit of FIG. 6.
Figure 8:
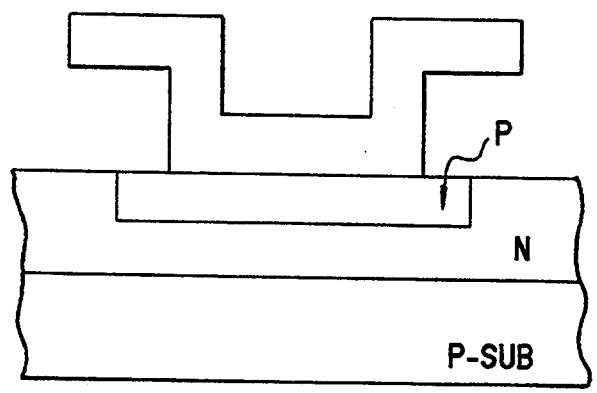
FIG. 8 is a diagram showing the structure of a diode used in the circuit of FIG. 6.

FIG. 7 is a top plan view showing the device arrangement in the circuit of FIG. 6, and FIG. 8 is a cross-sectional view of the diode 61A. The reference numeral 101AA is a contact hole for connecting the drain of the memory cell 1AA to the bit line 3A, 102A is a contact hole for connecting the select transistor 6A to the common source 5, 103A is a contact hole for connecting the diode 61A to the common source 5, and 104 is the floating gate of the memory cell 1AA. The same reference numerals are used in FIG. 8. The word line is formed from a second polysilicon layer, the bit line is formed from aluminum, the common source line 7A is formed from a diffused layer, and the floating gate is formed from a first polysilicon layer.

As can be seen from FIG. 7, the device arrangement requires that the diode to be provided between each common source line and the common source 5 be formed at the intersection between the common source line and the common source 5. Since the formation of such a diode requires a certain space, a larger spacing has to be provided between the word lines than in the structure that does not require the provision of such a diode. This not only makes it difficult to achieve a higher integration but introduces a problem in that extra steps have to be added to the wafer fabrication process in order to form such diodes.

As described above, the prior art flash memory has the problem that correct data readout cannot be done when memory cell transistors are put in an over-erased state as a result of erasure. On the other hand, the flash memory proposed to solve this problem has had a problem that has impeded the memory design for higher integration.

Figure 9:
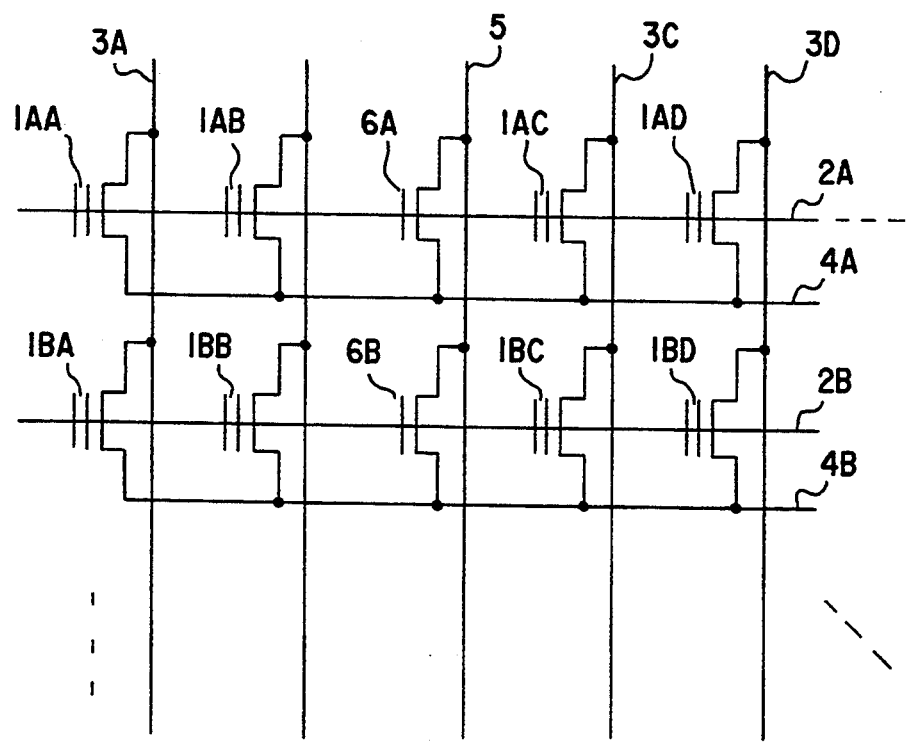
FIG. 9 is a diagram showing the basic configuration of a nonvolatile semiconductor memory according to a first mode of the present invention.
Figure 10A:
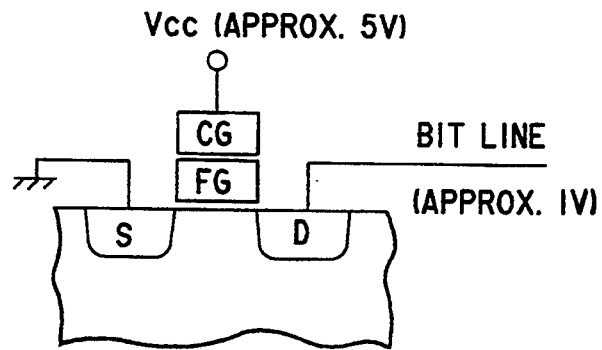
FIGS. 10A to 10C are diagrams showing the conditions of voltage application in various modes in the nonvolatile semiconductor memory according to the first mode of the present invention.
Figure 10B:
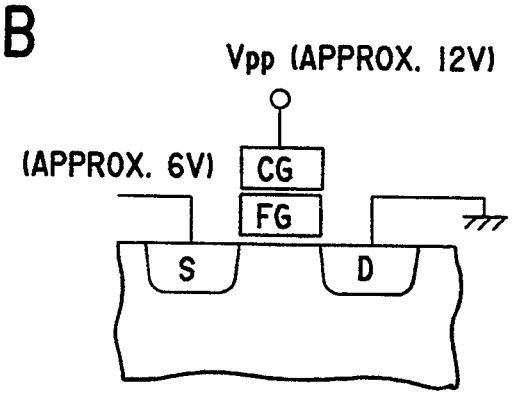
Figure 10C:
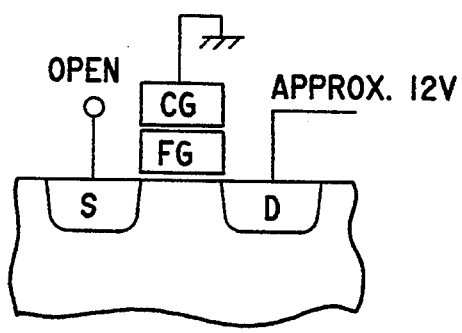

FIG. 9 is a diagram showing the basic construction of a nonvolatile semiconductor memory according to a first mode of the present invention. The flash memories of the first to seventh embodiments hereinafter described have the same basic configuration as shown in FIG. 9. FIGS. 10A to 10C are diagrams showing the conditions of voltages applied to various portions in various operating modes for the nonvolatile semiconductor memory of the first mode.

In FIG. 9, the reference numerals 2A, 2B, ..., and 3A, 3B, ..., indicate first row lines and first column lines, respectively, which are arranged in a grid pattern; 4A, 4B, ..., are second row lines arranged in parallel to the first row lines; 1AA, 1AB, 1AC, ..., 1BA, ..., are nonvolatile memory elements, each formed at an intersection between the first row lines and the first column lines and having a control electrode connected to one of the first row lines, a first electrode connected to one of the second row lines, and a second electrode connected to one of the first column lines; 5 represents a second column line arranged parallel to the first column lines; and 6A, 6B, ..., are active elements, each formed at an intersection between the second column line and the first row lines 2A, 2B, ..., and having a control electrode connected to one of the first row lines, a first electrode connected to the second column line 5, and a second electrode connected to one of the second row lines. For reading, a third voltage (5 V) is applied to the first row line to which the selected memory element is connected, and a first voltage (0 V) is applied to the remaining first row lines; further, a second voltage (1 V) is applied to the first column line to which the selected memory element is connected, and the first voltage (0 V) is applied to the remaining first column lines as well as to the second column line 5. For writing, a fifth voltage (12 V) is applied to the first row line to which the selected memory element is connected, and the first voltage (0 V) is applied to the remaining first row lines; further, the first voltage (0 V) is applied to the first column line to which the selected memory element is connected, a fourth voltage (6 V) is applied to the second column line 5, and the first column lines other than the one connecting to the selected memory element are opened. For erasure, a seventh voltage that puts the active elements, 6A, 6B, ..., in the nonconducting state is applied to the first row lines, and a sixth voltage, the erasure voltage, is applied to the first column lines.

Basically, the structure of the memory cell transistors is symmetrical between source and drain so that either can be used as the source or drain. It is therefore possible to set the source open and apply a high voltage to the drain for erasure, or conversely, to set the drain open and apply a positive voltage to the source for writing.

As can be seen from the comparison between FIGS. 9 and 6, the nonvolatile semiconductor memory of the invention includes the second row lines, 4A, 4B, ..., the second column line 5, and the active elements, 6A, 6B, ..., which correspond to the common source lines, the common source, and the select transistors, respectively, in the prior art construction, but the diodes that would connect the second column line 5 to the second row lines 4A, 4B, ..., are eliminated. In the prior art, the diodes were provided so that the high voltage applied to the second column line 5 for erasure could be applied to the associated second row lines. In the present invention, since these diodes are eliminated, a high voltage for erasure cannot be applied to the second row lines. Therefore, in the nonvolatile semiconductor memory of the invention, for erasure a high voltage is applied to the drain and the source is opened, as shown in FIG. 10C. Accordingly, it is not necessary to apply a high voltage to the source, allowing the elimination of the associated diode and thus contributing to increased integration and a simplified fabrication process.

As described above, the source and drain in the memory cell are basically interchangeable, but in reality, as will be detailed later, the electrode to which the positive voltage is applied during writing is so structured as to enhance the generation of hot carriers to improve the writing efficiency, and the electrode to which the high voltage is applied during erasure is so structured as to provide increased breakdown strength. In the prior art nonvolatile semiconductor memory, therefore, the first electrode (the source), which is connected to the common source line, is provided with such a structure as to provide increased breakdown strength, and the second electrode (the drain), which is connected to the bit line, is provided with such a structure that enhances the generation of hot carriers. On the other hand, in the present invention, since the high voltage for erasure is applied to the second electrode (the drain), the second electrode (the drain) needs to be structured so as to withstand a high voltage. However, since increasing the breakdown strength and enhancing the generation of hot carriers are contradictory demands, the second electrode (the drain) cannot be so configured as to enhance the generation of hot carriers. In the present invention, therefore, the first electrode (the source) has the structure that enhances the generation of hot carriers, and for writing, the relationship between the electrodes is reversed so that the positive voltage is applied to the first electrode (the source).

Figure 11:
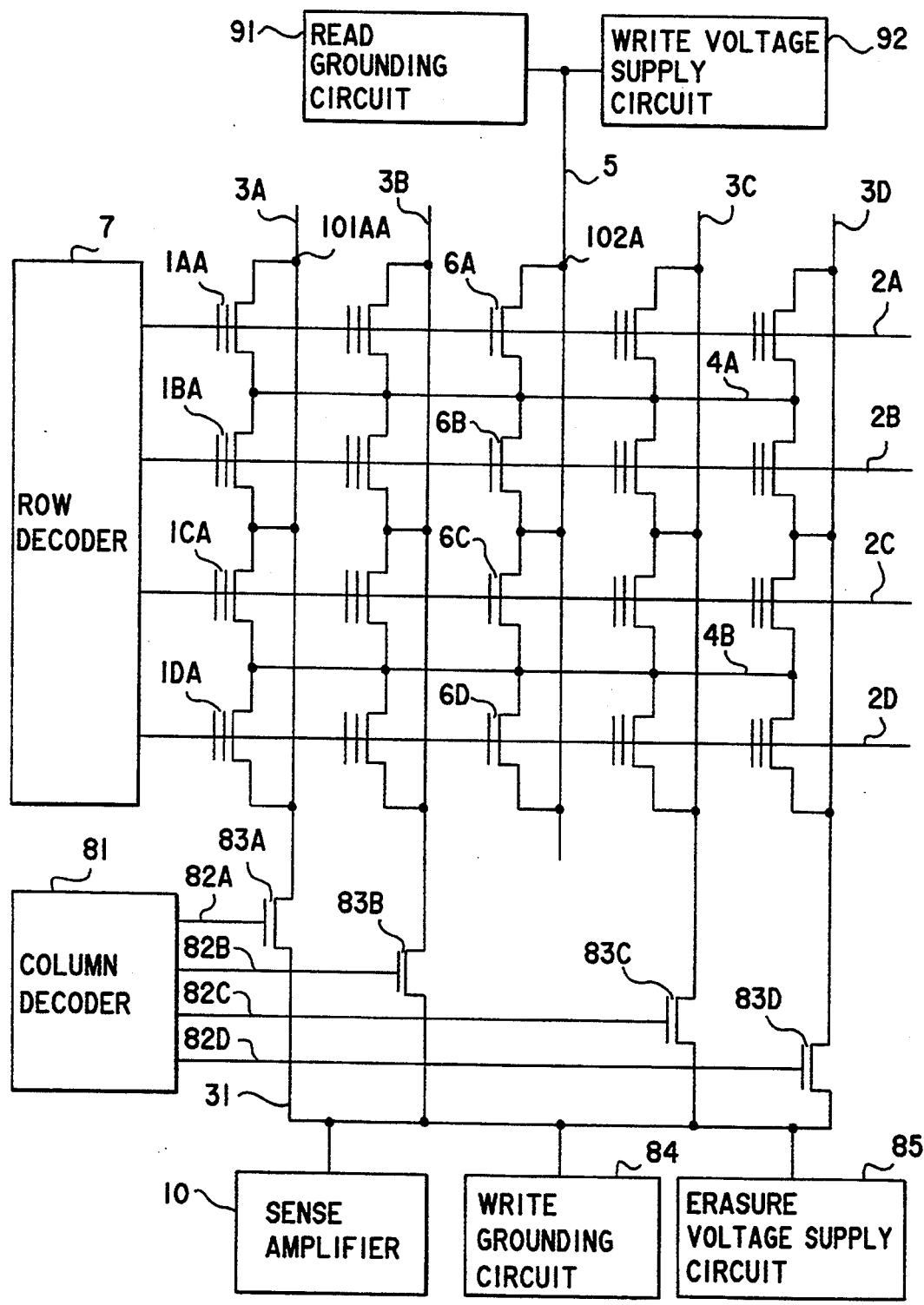
FIG. 11 is a diagram showing the configuration of a first embodiment of the present invention.

FIG. 11 is a diagram showing the configuration of a flash memory according to the first embodiment of the invention. In this embodiment, because of the limited space of the diagram, the memory is shown as comprising four word lines 2A, 2B, 2C, 2D, four bit lines 3A, 3B, 3C, 3D, and 16 memory cells 1AA, 1AB, . . . , but in reality, the memory contains far more memory cells than shown. The numerals 4A and 4B are the common source lines; the sources of the memory cells in the upper two rows are connected to 4A, and the sources of the memory cells in the lower two rows are connected to 4B. The numeral 5 designates the common source. The numerals 6A to 6D are select transistors, one provided for each word line. The gate of each transistor is connected to its associated word line, the first electrode is connected to the common source 5, and the second electrode is connected to the common source line 4A or 4B. The numeral 7 is a row decoder that decodes an address signal and applies a voltage to the selected word line. The numerals 81 to 85 designate sections for controlling voltages applied to the bit lines 3A, 3B, 3C, and 3D. The column decoder indicated at 81 decodes an address signal and outputs a column select signal in accordance with which the column gate transistors 83A to 83D control the connection of the respective bit lines to a bus line 31. The numeral 84 is a write grounding circuit for connecting the selected bit line to 0 V during writing, and 85 is an erasure voltage supply circuit for applying a high voltage for erasure to the selected bit line. The numeral 10 is a sense amplifier which senses the current flowing through the bit line during reading and thereby reads the data stored in the memory cell. The numerals 91 and 92 are circuits for controlling the voltage applied to the common source 5: 91 is a read grounding circuit for connecting the common source 5 to 0 V during reading, and 92 is a write voltage supply circuit for supplying a positive voltage to the common source 5 for reading.

Figure 12:
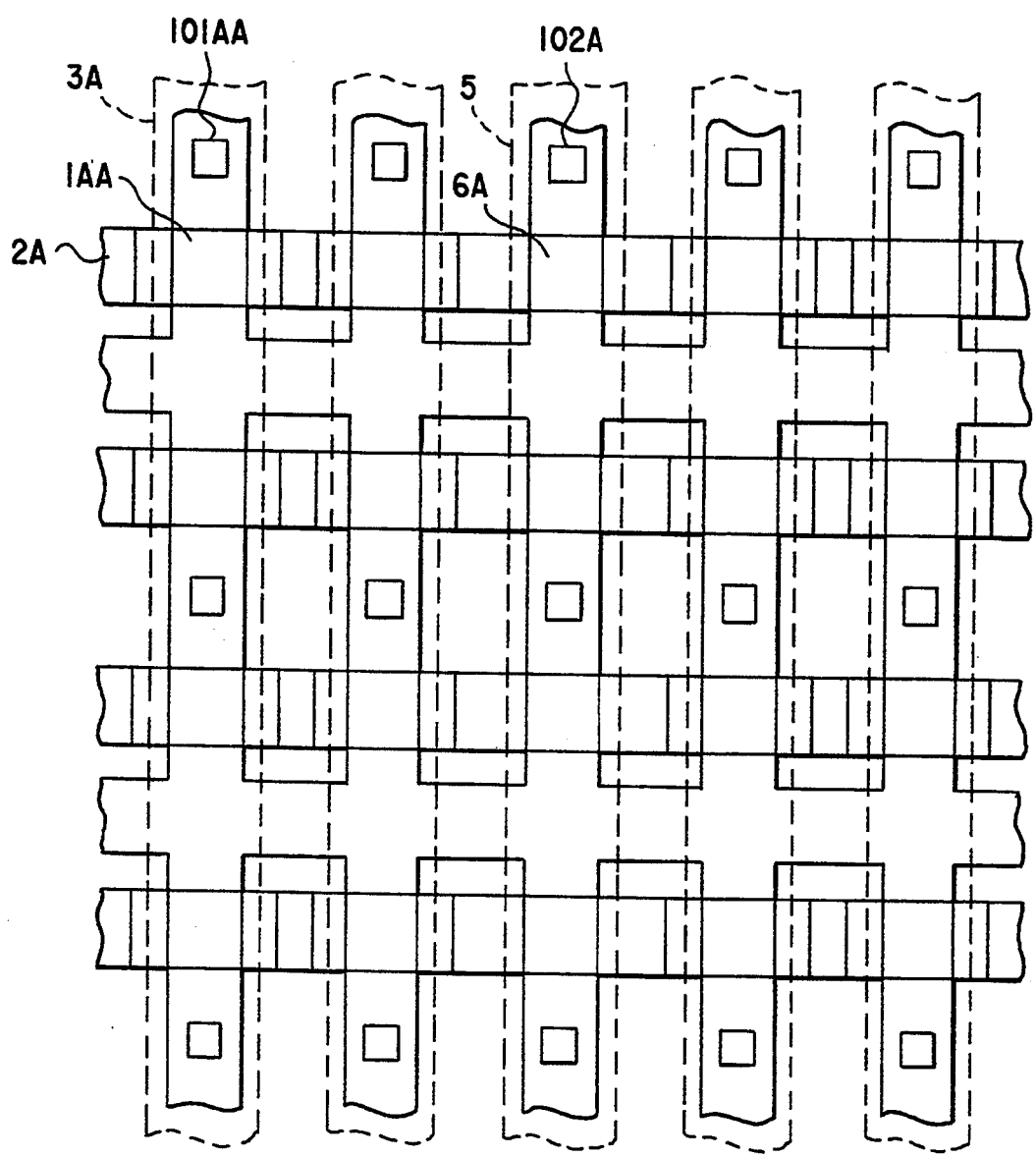
FIG. 12 is a top plan view showing a device arrangement in the first embodiment.

FIG. 12 is a top plan view showing the device arrangement in the flash memory of the first embodiment.

The numeral 101AA is a contact hole for connecting the drain of the memory cell 1AA to the bit line, and 102A is a contact hole for connecting the source select transistor 6A to the common source 5. The numerals indicate the same parts as shown by the same numerals in FIG. 11. As explained with reference to FIG. 7, the word line is formed from a second polysilicon layer, the bit line is formed from aluminum, the common source line 7A is formed from a diffused layer, and the floating gate is formed from a first polysilicon layer.

Figure 13:
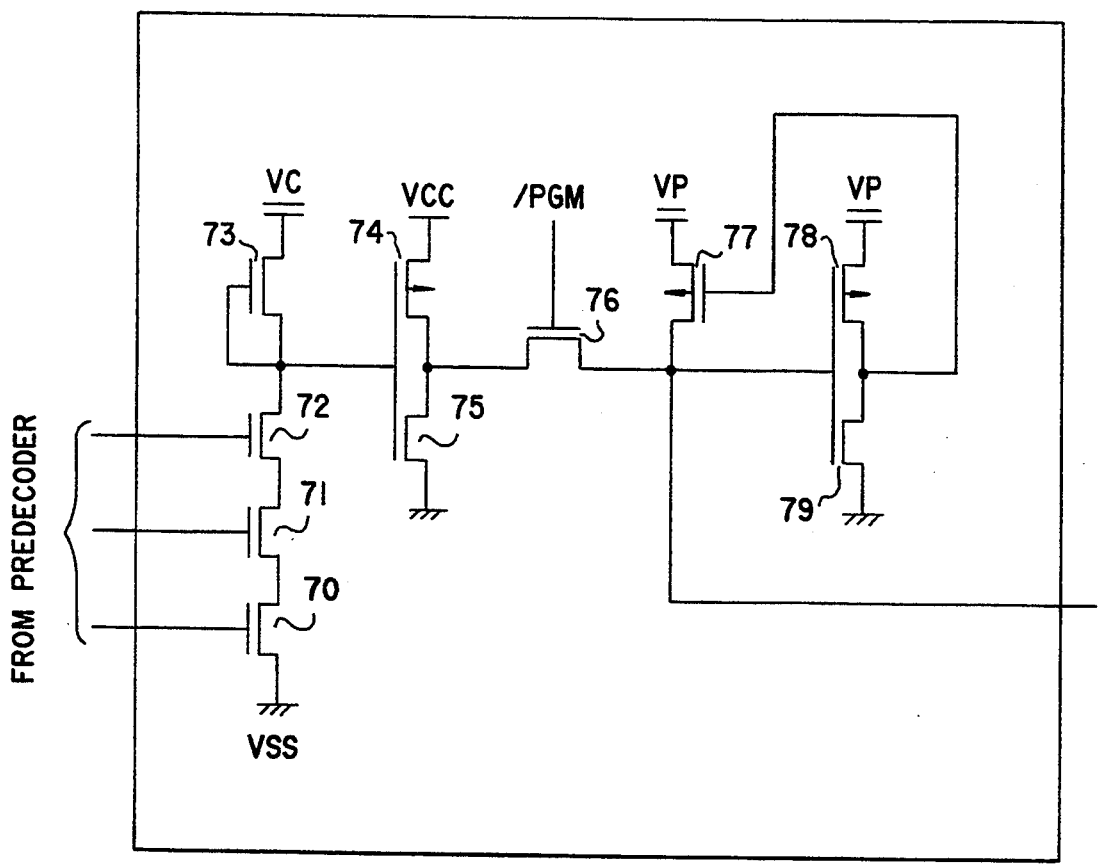
FIG. 13 is a diagram showing the circuit configuration of a decoder section in the first embodiment.

FIG. 13 is a diagram showing a portion of the circuit configuration of the row decoder 7, wherein 70, 71, 72, 75, and 79 are n-channel enhancement-mode transistors, 74, 77, and 78 are p-channel enhancement-mode transistors, and 73 is an n-channel depletion-mode transistor. This circuit configuration is well known, and therefore, detailed explanation will not be given here. 5 V is applied to VCC. /PGM is a write control signal which is 0 V for writing and 5 V for other operations. VP is at 5 V for reading and 12 V for writing, and a prescribed voltage is output according to the activated mode and according to whether the word line is in the select or deselect state. VC is normally at 5 V, but is set to 0 V when the erasure voltage is to be applied to all the bit lines for erasure.

The column decoder 81 has fundamentally the same circuit configuration as that shown in FIG. 13, the difference being in the voltage values for /PGM and VP. That is, /PGM is 5 V for reading and 0 V for other operations, while VP is 5 V for reading and 12 V for other operations.

Figure 14:
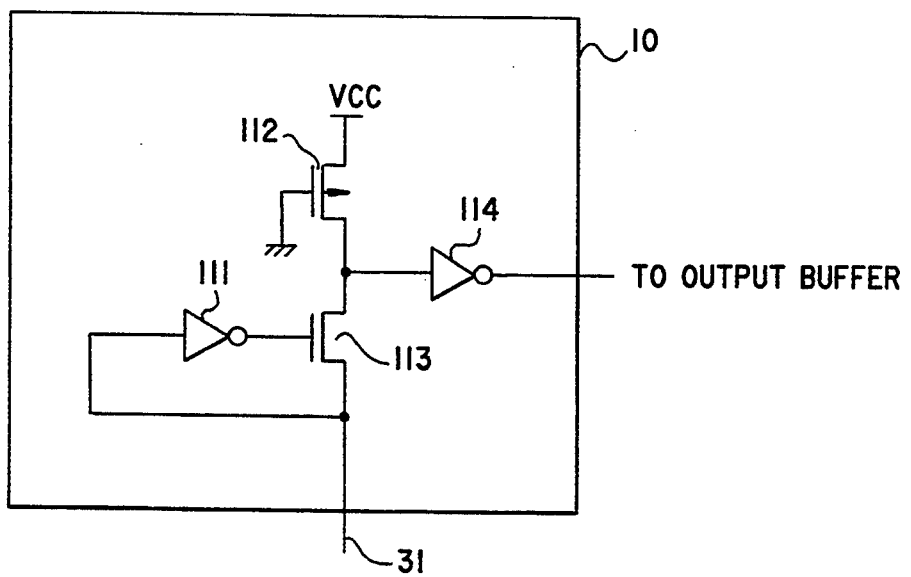
FIG. 14 is a diagram showing the configuration of a sense amplifier circuit in the first embodiment.
Figure 15:
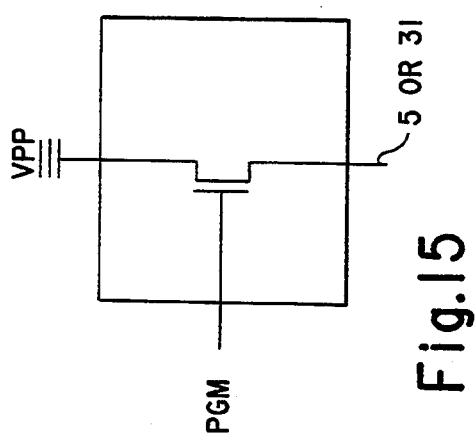
FIG. 15 is a diagram showing the configuration of a write voltage supply circuit/erasure voltage supply circuit in the first embodiment.
Figure 16:
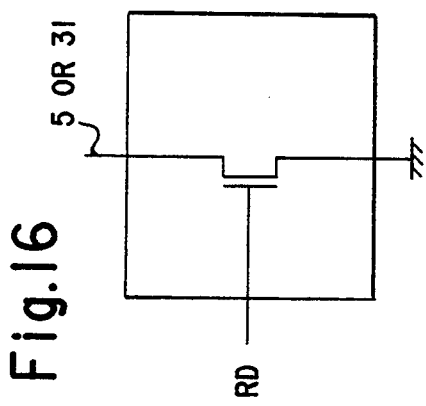
FIG. 16 is a diagram showing the configuration of a read grounding circuit/write grounding circuit in the first embodiment.

FIG. 14 is a diagram showing the circuit configuration of the sense amplifier 10, FIG. 15 is a diagram showing the circuit configuration of the write voltage supply circuit 92 and the erasure voltage supply circuit 85, and FIG. 16 is a diagram showing the circuit configuration of the read grounding circuit 91 and the write grounding circuit 84. These circuits are well known, and therefore, their explanation will not be given here.

The operation of the present embodiment will be described below, assuming that the memory cell 1AA is selected for access.

For reading, the row decoder 7 drives the word line 2A, to which the memory cell 1AA is connected, to "H" (about 5 V), and the other word lines, 2B, 2C, and 2D, to "L" (about 0 V), while the column decoder 81 drives the column gate select line 82A to "H" (about 5 V), and the other column gate select lines, 82B, 82C, and 82D, to "L" (about 0 V). At the same time, the common source 5 is set at about 0 V by the read grounding circuit 91, and the write voltage supply circuit 92 is set open; on the other hand, the bus line 31 is set at about 1 V by the sense amplifier 10, and the write grounding circuit 84 and the erasure voltage supply circuit 85 are both set open. As a result, the source select transistor 6A is turned on, driving the common source line 4A to about 0 V, while the column gate transistor 83A is turned on, driving the bit line 3A to about 1 V. That is, about 0 V is applied to the source of the selected memory cell 1AA, about 1 V is applied to its drain, and about 5 V is applied to its control gate. This causes current to flow through the bit line 3A, and the current amount, which varies according to the stored data, is detected by the sense amplifier 10. The voltage of about 5 V is also applied to the control gates of the other memory cells connected to the word line 2A, but the bits lines to which these memory cells are connected will have no effect on the bus line 31 since the column gate transistors 83B, 83C, and 83D are OFF. Further, a mere 0 V is applied to the control gates of the other memory cells connected to the bit line 3A, so that the states of the data stored in them will have no effect on the bit line.

The common source line 4B to which the sources of the memory cells 1CA and 1DA are connected is open because the source select transistors 6C and 6D are OFF; therefore, even if the memory cells 1CA and 1DA are in an over-erased state, there is no concern of leakage current flowing into the bit line 3A. In the present embodiment, however, since the common source line 4A to which the source of the memory cell 1BA is connected remains connected to the common source 5, if the memory cell 1BA is in an over-erased state, leakage current will flow into the bit line 3A. However, as previously noted, the magnitude of the leakage current flowing from each individual memory cell due to over-erasure is very small, so that the leakage current from only one over-erased memory cell can almost be neglected. Thus, with the configuration of FIG. 11, even when a large number of memory cells are connected to the same bit line, leakage current can only flow from adjacent memory cells, so that over-erasure causes no ill effect on correct data readout.

For writing, the row decoder 7 drives the word line 2A, to which the memory cell 1AA is connected, to "H" (about 12 V), and the other word lines, 2B, 2C, and 2D, to "L" (about 0 V), while the column decoder 81 drives the column gate select line 82A to "H" (about 5 V or 12 V), and the other column gate select lines, 82B, 82C, and 82D, to "L" (about 0 V). At the same time, the common source 5 is set at about 6 V by the write voltage supply circuit 92, and the read grounding circuit 91 is set open; on the other hand, the bus line 31 is set at about 0 or 6 V by the write grounding circuit 84, and the sense amplifier 10 and the erasure voltage supply circuit 85 are both set open. As a result, the source select transistor 6A is turned on, driving the common source line 4A to about 6 V, while the column gate transistor 83A is turned on, driving the bit line 3A to about 0 or 6 V. That is, about 6 V is applied to the source of the selected memory cell 1AA, about 0 or 6 V is applied to its drain, and about 12 V is applied to its control gate. By setting the voltage of the write grounding circuit 84 at about 0 or 6 V according to the data to be written, data "0" or "1" is written.

For erasure, the row decoder 7 drives all the word lines 2A, 2B, 2C, and 2D to "L" (about 0 V), while the column decoder 81 drives the column gate select line 82A to "H" (about 12 V) and the other column gate select lines 82B, 82C, and 82D to "L" (about 0 V). At the same time, the read grounding circuit 91 and the write voltage supply circuit 92 are set open; on the other hand, the bus line 31 is set at about 12 V by the erasure voltage supply circuit 85, and the write grounding circuit 84 and the sense amplifier 10 are both set open. As a result, the source select transistors 6A and 6B are turned off, setting the common source line 4A open, while the column gate transistor 83A is turned on, driving the bit line 3A to about 10 V. That is, the sources of the memory cells 1AA, 1BA, 1CA, and 1DA connected to the bit line 3A are open, and about 10 V is applied to their drains with their control gates held at about 0 V, so that electrons on their floating gates are removed. As a result, all of these memory cells are put into an erased state, that is, a "1" has been written into each memory cell.

In the above example, erasure is performed on one bit line at a time; alternatively, if the column gate 81 is configured to output such a signal as to simultaneously turn on more than one column gate transistor for erasure, memory cells connected to a plurality of bit lines can be erased all at the same time.

As described, according to the first embodiment, in a configuration where source select transistors are provided to ensure correct data readout despite the occurrence of over-erased memory cells, there is no need to provide diodes via which to apply an erasure voltage to the common source lines. As a result, the spacing between memory cell rows can be reduced, as shown in FIG. 12, and also, the fabrication step for forming the diodes can be eliminated. This achieves a flash memory with increased integration and a reduced cost.

Furthermore, the bit-line selective erasure capability of the flash memory of this embodiment serves to increase the range of its applications.

The memory element of the prior art flash memory has the structure shown in FIG. 3, where for erasure a high voltage of the order of 12 V is applied to the source. In this structure, however, if the junction breakdown strength of the source is insufficient, a junction breakdown current will flow and the erasure current will increase rapidly. Another problem is that hot carriers generated by the junction breakdown current will become trapped in the gate oxide film, degrading the write/erasure characteristics. To avoid these problems, structural modifications are made to increase the junction breakdown strength for the source by reducing the impurity concentration gradient, for example, so that the source can sustain the high voltage.

In the memory element of the prior art flash memory, for writing a write voltage of the order of 6 V is applied to the drain, and hot carriers generated by the avalanche breakdown occurring near the drain are injected into the floating gate to accomplish the writing. If the hot carrier generation efficiency near the drain is low, the write characteristic will degrade. To avoid this problem, structural modifications are made to the drain to enhance the hot carrier generation efficiency, for example, by increasing the impurity concentration gradient.

In the present invention, however, since the drain-source relationship is reversed from the prior art arrangement for writing and erasure, if the source is so configured as to provide increased breakdown strength and the drain is so configured as to enhance the hot carrier generation efficiency, as is practiced in the prior art, the junction breakdown strength of the drain to which the high voltage is applied will be insufficient and the hot carrier generation efficiency will be low near the source where hot carriers are generated at the time of writing. The second to fourth embodiments hereinafter described are intended to resolve such problems.

Figure 17:
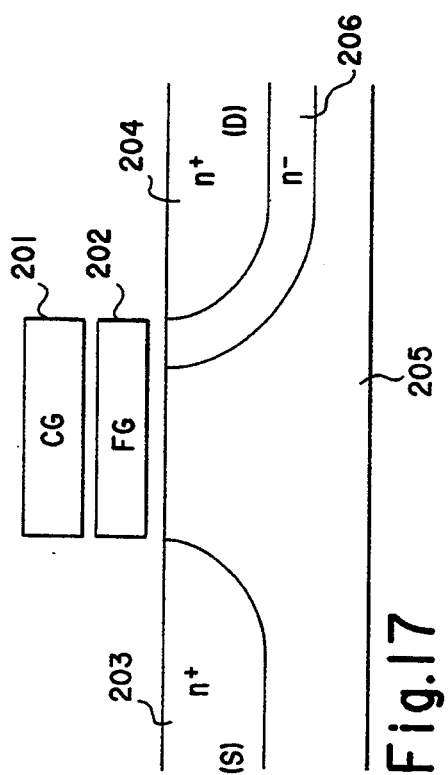
FIG. 17 is a diagram showing a device structure according to a second embodiment of the present invention.

FIG. 17 is a diagram showing the structure of a memory element according to the second embodiment wherein the junction breakdown strength of the drain is improved. As is apparent from the comparison with FIG. 3, the memory element structure of this embodiment is different from that of the prior art shown in FIG. 3 in that, in this embodiment, an $n^-$ region 206 is formed between the drain 204, an $n^+$ region, and the channel and substrate (P-SUB) 205. In any prior art flash memory cell structure designed to improve the junction breakdown strength, structural modifications for increased junction breakdown strength are done only on the source, as previously described, and there are no examples in which structural modifications for increased junction breakdown strength are done on the drain, as in the present embodiment. With this modification, the impurity concentration gradient in the drain region 204 is reduced and the junction breakdown strength is thus improved. This serves to reduce the junction breakdown current that flows when the high erasure voltage is applied to the drain.

For reading also, since a voltage of about 1 V is applied to the drain 204 having increased breakdown strength, hot carriers generated near the drain 204 are trapped in a gradual manner over a longer period of time, so that problems such as soft write or read disturb due to a threshold shift are alleviated as compared with the prior art structure.

For writing, a write voltage of the order of 6 V is applied not to the drain 204 that has a reduced impurity concentration gradient, but to the source that has a normal impurity concentration gradient. This prevents the problem of write characteristic degradation.

Figure 18:
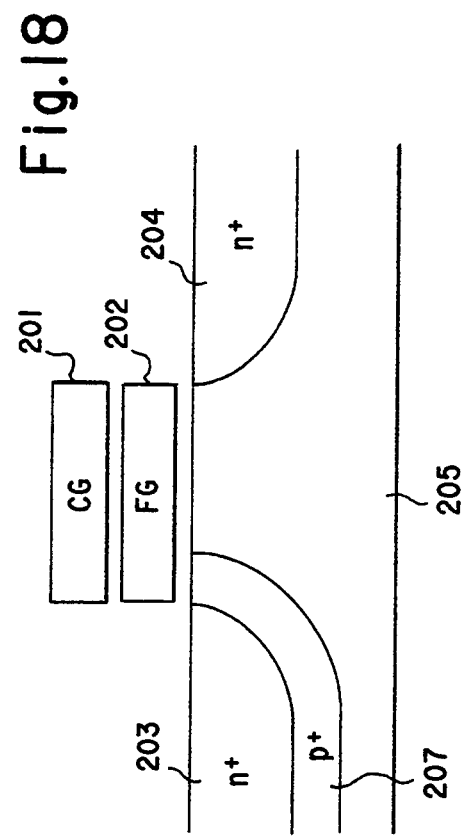
FIG. 18 is a diagram showing a device structure according to a third embodiment of the present invention.

FIG. 18 is a diagram showing the structure of a memory element according to the third embodiment wherein the source is so structured to enhance the hot carrier generation efficiency. As is apparent from the comparison with FIG. 3, the memory element structure of this embodiment is different from that of the prior art shown in FIG. 3 in that, in this embodiment, a p+ region is formed between the source 203, an n+ region, and the channel and substrate (P-SUB) 205. In any prior art flash memory cell structure designed to enhance the hot carrier generation efficiency, structural modifications for enhancing the hot carrier generation efficiency are done only on the drain, as previously described, and there are no examples in which structural modifications for enhancing the hot carrier generation efficiency are done on the source, as in the present embodiment. With this modification, the impurity concentration gradient in the source region 203 is made steeper and the hot carrier generation efficiency is thus enhanced. This serves to improve the write characteristic.

For reading, since a voltage of about 1 V is applied to the drain 204, hot carriers generated near the drain 204 are trapped in a gradual manner over a longer period of time, thus preventing problems such as soft write or read disturb due to a threshold shift.

For erasure, the high voltage for erasure of the order of 10 V is applied not to the source 203 that has a steep impurity concentration gradient, but to the drain that has a normal impurity concentration gradient. This prevents the problem of write/erase characteristic degradation due to the hot carriers generated by increased junction breakdown current and trapped in the gate oxide film.

Figure 19:
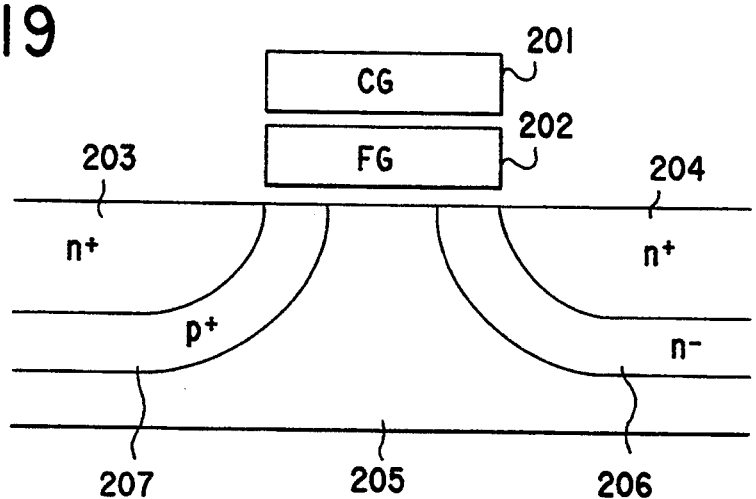
FIG. 19 is a diagram showing a device structure according to a fourth embodiment of the present invention.

FIG. 19 is a diagram showing the structure of a memory element according to the fourth embodiment wherein the structural modification of the second embodiment and the structural modification of the third embodiment are combined. That is, in the fourth embodiment, the modification for increasing the junction breakdown strength is done on the drain, and the modification for enhancing the hot carrier generation efficiency is done on the source. By combining the features of the second and third embodiments, the reduction of the junction breakdown current and the improvement of the write characteristic can be achieved simultaneously.

For flash memories, a negative voltage erasure method is proposed in which a negative voltage is applied to the control gate in order to reduce the erasure voltage applied to the source for erasure. The fifth embodiment hereinafter described is concerned with an example in which the present invention is applied to a flash memory that employs such a negative voltage erasure method.

Figure 20:
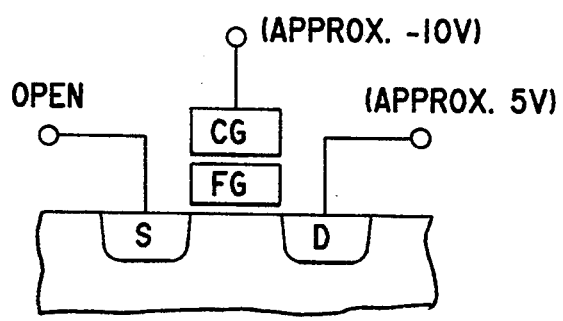
FIG. 20 is a diagram showing the condition of voltage application for erasure in a fifth embodiment of the present invention.

The flash memory of the fifth embodiment has the same configuration as that of the first embodiment shown in FIG. 11, the only difference being in the voltages applied for erasure. FIG. 20 is a diagram showing the voltages applied for erasure according to the fifth embodiment. As shown, about −10 V is applied to the control gate CG and about 5 V is applied to the drain D, with the source S left open. To accomplish such applied voltage conditions, for erasure the row decoder 7 drives all the word lines 2A, 2B, 2C, and 2D to "L" at about −10 V, while the column decoder 81 drives the column gate select line 82A to "H" (about 7 V) and the other column gate select lines 82B, 82C, and 82D to "L" (about 0 V). At the same time, the read grounding circuit 91 and the write voltage supply circuit 92 are set open; on the other hand, the bus line 31 is set at about 5 V by the erasure voltage supply circuit 85, and the write grounding circuit 84 and the sense amplifier 10 are both set open. As a result, the source select transistors 6A and 6B are turned off, setting the common source line 4A open, while the column gate transistor 83A is turned on, driving the bit line to about 5 V. That is, the sources of the memory cells, 1AA, 1BA, 1CA, and 1DA, connected to the bit line 3A are set open, while about 5 V is applied to their drains and about −10 V is applied to their control gates, so that electrons are removed from the control gate of each memory cell. As a result, all of these memory cells are put in an erased state, i.e., a "1" has been written into each cell.

According to this embodiment, the erasure voltage applied to the drain can be reduced to about 5 V, which effectively prevents the problem that causes junction breakdown current flow. Furthermore, since the drain need not be subjected to a high voltage, the embodiment eliminates the need for such modifications as mentioned previously, i.e., reducing the impurity concentration gradient to improve the drain breakdown strength of the drain. Furthermore, if the voltages applied to the word lines from the row decoder 7 are selectively made negative, then erasure can be accomplished not only on a bit line basis but on a word line basis. This adds to the operational flexibility.

In the first to fifth embodiments heretofore described, the erasure voltage is selectively applied via the bit line, which enhances the operational flexibility. On the other hand, one of the features of flash memory is its total erasure capability whereby all the memory cells can be erased at a time, and this total erasure capability provides a merit of its own. The sixth embodiment hereinafter described is concerned with an example in which all the memory cells are erasable simultaneously.

Figure 21:
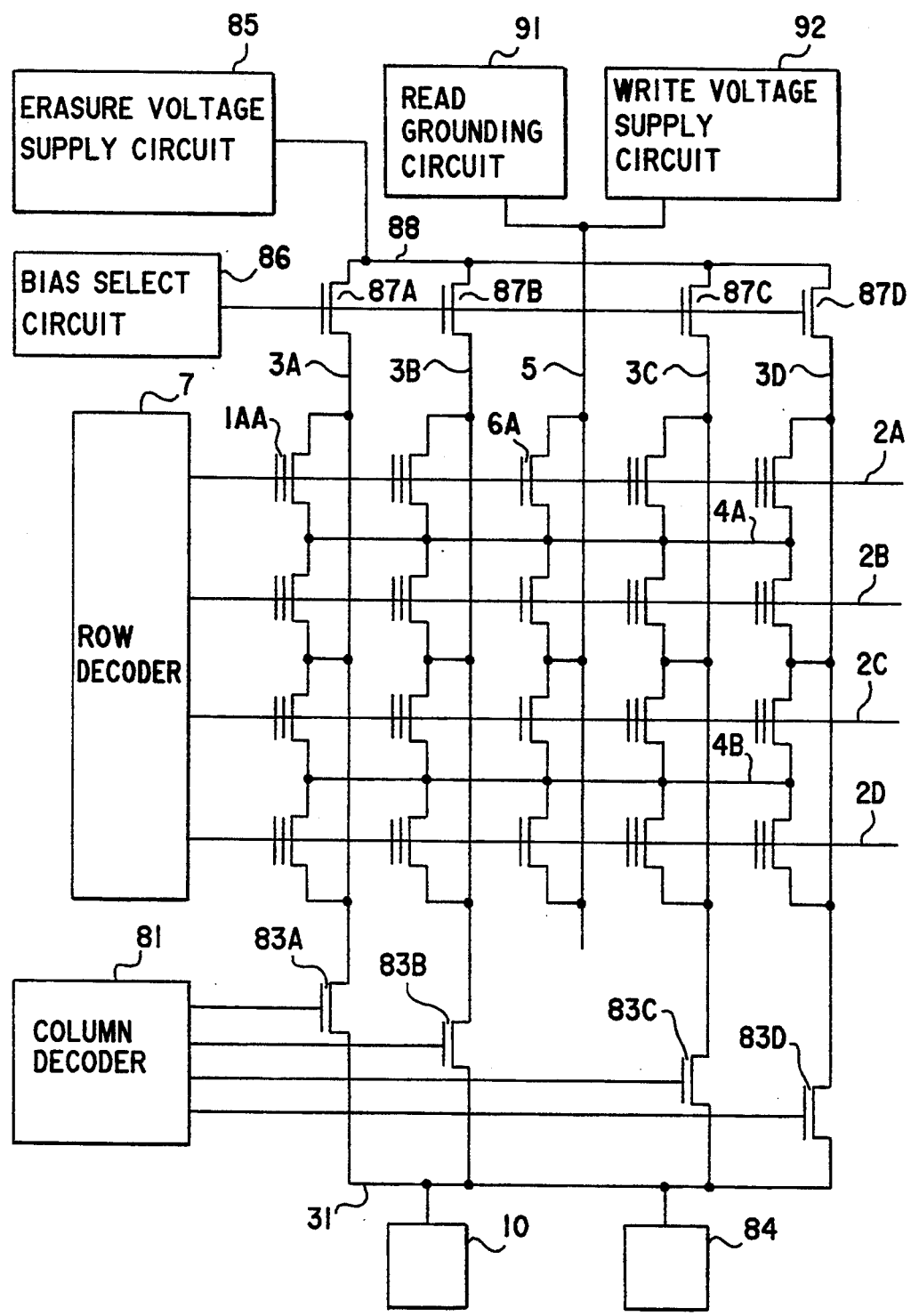
FIG. 21 is a diagram showing the configuration of a sixth embodiment of the present invention.

FIG. 21 is a diagram showing the configuration of a flash memory according to the sixth embodiment. As is apparent from the comparison with FIG. 11, the difference from the configuration of the first embodiment is that, in the sixth embodiment, bit line biasing transistors 87A, 87B, 87C, and 87D are connected to the opposite ends of the bit lines 3A, 3B, 3C, and 3D from the ends thereof connected to the column gate transistors 83A to 83D, the other ends of the bit biasing transistors 87A, 87B, 87C, and 87D being connected to an erasure voltage supply line 88 which, in turn, is connected to the erasure voltage supply circuit 85. The gate electrodes of the bit line biasing transistors 87A, 87B, 87C, and 87D are coupled to the output of a bit line bias select circuit 86 which outputs a signal to cause the bit line biasing transistors to conduct during erasure. By comparison, in FIG. 11, the erasure voltage supply circuit 85 is connected to the bus line 31.

In the circuit of the sixth embodiment shown in FIG. 21, the read and write operations are the same as in the circuit shown in FIG. 11. In the circuit of FIG. 11, the erasure voltage supply circuit 85 is open during read and write operations; in the circuit of FIG. 21 also, the bit line biasing transistors 87A, 87B, 87C, and 87D are put in the nonconducting state during read and write operations, which is equivalent to being set in the open state. Thus, the read and write operations of the circuit of the sixth embodiment are the same as in the first embodiment, and therefore, explanation of these operations is not given here.

For erasure, the row decoder 7 drives all the word lines 2A, 2B, 2C, and 2D to "L" (about 0 V), the column decoder 81 drives the column gate select lines 82A, 82B, 82C, and 82D to "L" (about 0 V), and the bit line bias select circuit 86 sets its output to "H" (about 12 V). At the same time, the read grounding circuit 91 and the write voltage supply circuit 92 are set open, the erasure voltage supply line 88 is driven to about 12 V by the erasure voltage supply circuit 85, and the write grounding circuit 84 and the sense amplifier 10 are both set open. As a result, the source select transistors 6A and 6B are OFF, setting the common source line 4A open, and the column gate transistors 83A, 83B, 83C, and 83D are also OFF, while the bit line biasing transistors 87A, 87B, 87C, and 87D are all ON, driving the bit lines 3A, 3B, 3C, and 3D to about 10 V. That is, the sources of all the memory cells are set open, about 10 V is applied to their drains, and about 0 V is applied to their control gates, so that electrons are removed from their floating gates. As a result, all the memory cells are put in an erased state, i.e., a "1" has been written into each memory cell.

In the circuit of FIG. 11 also, if all the column gate select lines are put in the selected state by the column decoder 81 to select all the bit lines 3A, 3B, 3C, and 3D, all the memory cells can be erased simultaneously. If the decoder circuit of FIG. 13 is used for the column decoder circuit, all the column gate select lines can be put simultaneously in the selected state by setting VC shown in FIG. 13 to 0 V.

Alternatively, if such a signal as to select a plurality of output lines is given as the predecoder output to the column decoder circuit, a plurality of bit lines can be selected for erasure, thus achieving a sector erasure.

In the circuit of the first embodiment shown in FIG. 12, the memory cells deselected for writing but connected to the same word line as the memory cell selected for writing have their drains open, while about 12 V is applied to their control gates and about 6 V is applied to their sources. As a result, these memory cells are activated, which gives rise to the possibility that the bit lines 3B, 3C, and 3D may be charged up because of the respective channel currents. These channel currents flowing into the respective bit lines may cause erroneous writing. The seventh embodiment hereinafter described is concerned with an example in which such erroneous writing is prevented.

Figure 22:
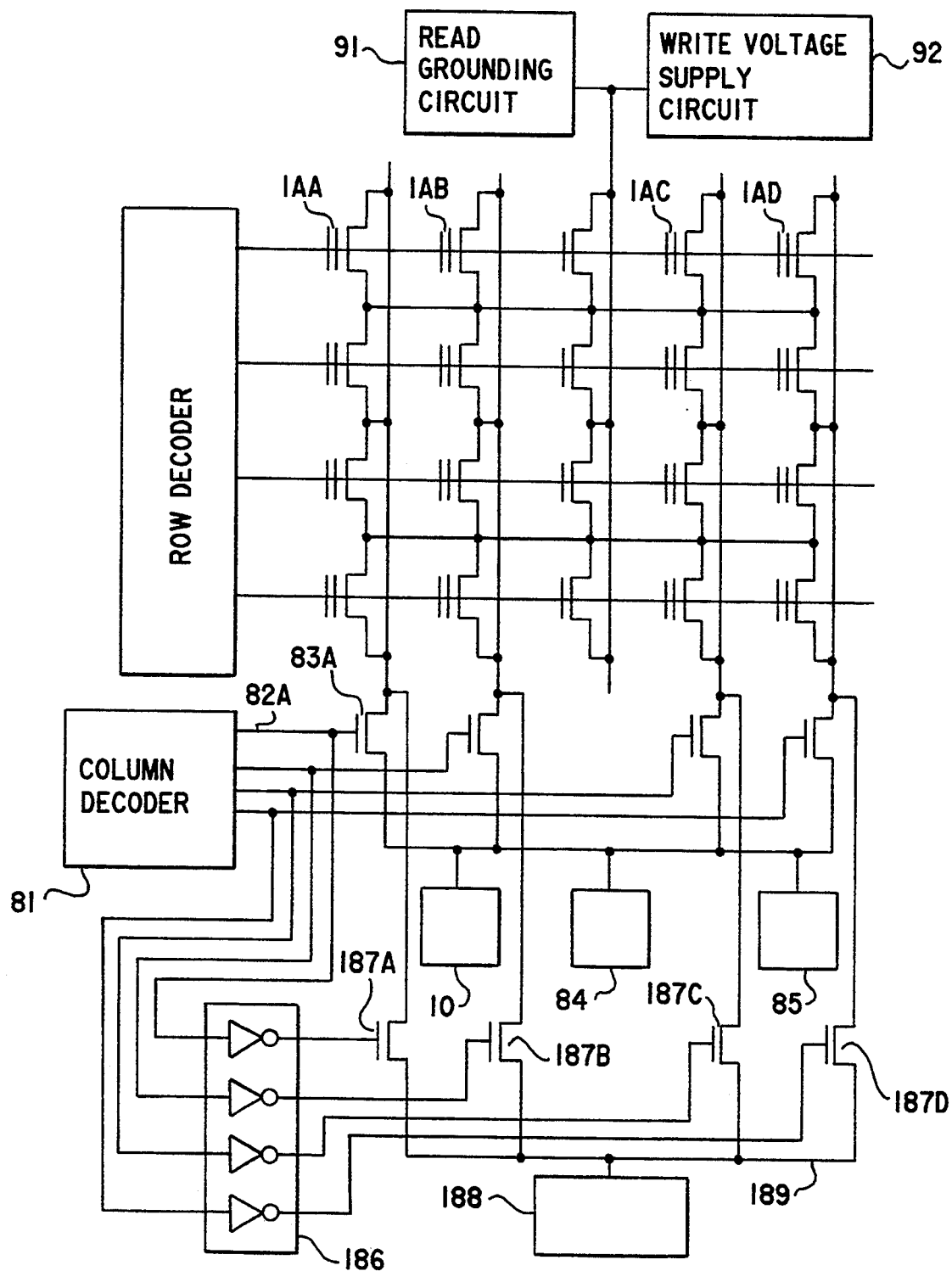
FIG. 22 is a diagram showing the configuration of a seventh embodiment of the present invention.

FIG. 22 shows the configuration of the seventh embodiment. As is apparent from the comparison with FIG. 11, the difference from the configuration of FIG. 11 is that, in the seventh embodiment, the bit lines 3A, 3B, 3C, and 3D are connected common to a second bus line 189 via second column gate transistors 187A, 187B, 187C, and 187D, respectively. The gates of the second column gate transistors 187A, 187B, 187C, and 187D are connected to an inverter circuit 186 which inverts the respective outputs of the column decoder 81; on the other hand, the second bus line 189 is connected to an erroneous-writing prevention voltage supply circuit 188.

The read and erase operations of the circuit of FIG. 22 are the same as the corresponding operations of the first embodiment, but the write operation is different. For writing into the memory cell 1AA, for example, the row decoder 7 drives the word line 2A, to which the memory cell 1AA is connected, to "H" (about 12 V), and the other word lines 2B, 2C, and 2D to "L" (about 0 V), while the column decoder 81 drives the column gate select line 82A to "H" (about 5 V or 12 V) and the other column gate select lines 82B, 82C, and 82D to "L" (about 0 V). At the same time, the common source 5 is set at about 6 V by the write voltage supply circuit 92, and the read grounding circuit 91 is set open; on the other hand, the bus line 31 is driven to about 0 V or 6 V by the write grounding circuit 84, the sense amplifier 10 and the erasure voltage supply circuit 85 are both set open, and the second bus line 189 is driven to about 6 V by the erroneous-writing prevention voltage supply circuit 188. As a result, the source select transistor 6A is ON, driving the common source line 4A to about 6 V, while of the column gate transistors, 83A is ON and 83B, 83C, and 83D are OFF, and of the second column gate transistors, 187A is OFF and 187B, 187C, and 187D are ON, so that the bit line 3A is driven to about 0 or 6 V and the bit lines 3B, 3C, and 3D are driven to about 6 V. That is, about 6 V is applied to the source of the selected memory cell 1AA, about 0 or 6 V is applied to its drain, and about 12 V is applied to its control gate. By setting the voltage of the write grounding circuit 84 at about 0 or 6 V according to the data to be written, data "0" or "1" is written. In the other memory cells 1AB, 1AC, and 1AD connected to the word line 2A, about 6 V is applied to their sources, about 6 V is applied to their drains, and about 12 V is applied to their control gates, so that no channel current will flow even if the memory cells are activated, thus reducing the possibility of erroneous writing due to channel current flow.

Thus, according to the seventh embodiment, the possibility of erroneous writing is reduced, but it will be appreciated that the possibility of erroneous writing can be further reduced by adjusting the timing of voltage application to the various parts for writing. FIGS. 23 and 24 are diagrams each showing an example of the voltage application timing.

For writing into the memory cell 1AA, for example, the write voltage and the erroneous-writing prevention voltage are applied to the common source line 4A and the deselected bit lines 3B, 3C, and 3D almost at the same time, as shown in FIG. 23. This further ensures the prevention of erroneous writing that may occur due to a transient potential difference between the sources and drains of the memory cells.

In an alternative method, when the write voltage and the erroneous-writing prevention voltage are applied to the common source line 4A and the deselected bit lines 3B, 3C, and 3D at different timings, erroneous writing due to the transient potential difference can also be prevented if the voltage applied to the word line is made to rise after the application of the write voltage and the erroneous-writing prevention voltage, as shown in FIG. 24.

As described above, according to the first mode of the present invention, in a nonvolatile semiconductor memory having a source select transistor for selecting a common source line to ensure correct data readout despite the occurrence of over-erased memory cells, there is no need to provide diodes via which to apply the erasure voltage. This contributes to device miniaturization and simplifies the fabrication process, allowing a reduction in fabrication costs. Furthermore, degradation of the write and erase characteristics is prevented in such a nonvolatile semiconductor memory.

Referring now to FIGS. 25 to 29, an electrically totally erasable and rewritable nonvolatile memory according to a second mode of the invention will be described below by way of example in accordance with eighth and ninth embodiments.

FIG. 25 is a block diagram showing an essential portion of the eighth embodiment of the present invention. In the figure, the numeral 11 designates a chip and the numerals 12a and 12b each designate a memory cell array consisting of memory cells.

Further, the numeral 171 is a row address signal input terminal, 172 is a row address buffer which latches a row address signal input via the row address signal input terminal 171, and 173 is a main row decoder for selecting and driving a common source line by decoding an internal row address signal fed from the row address buffer 172.

The numeral 174a is a sub-row decoder for selecting a word line in the memory cell array 12a in accordance with the output of the main row decoder 173, and 174b is a sub row decoder for selecting a word line in the memory cell array 12b in accordance with the output of the main row decoder 173.

The numeral 181 is a column address signal input terminal, 182 is a column address buffer which latches a column address signal input via the column address signal input terminal 181, and 183 is a main column decoder for decoding an internal column address signal fed from the column address buffer 182.

The numeral 184a is a sub-column decoder for outputting a column select signal for selecting a column in the memory cell array 12a in accordance with the output of the main column decoder 183, and 184b is a sub column decoder for outputting a column select signal for selecting a column in the memory cell array 12b in accordance with the output of the main column decoder 183.

The numeral 83a is a column gate for selecting a column in the memory cell array 12a in accordance with the column select signal fed from the sub-column decoder 184a, and 83b is a column gate for selecting a column in the memory cell array 12b in accordance with the column select signal fed from the sub-column decoder 184b.

The numeral 10a is a sense amplifier for amplifying data read out of the memory cell array 12a, and 10b is a sense amplifier for amplifying data read out of the memory cell array 12b.

The numeral 175 is a block address signal input terminal, and 176 is a block address buffer which latches a block address input via the block address signal input terminal 175.

The numeral 177 is a block address decoder which decodes an internal block address signal fed from the block address buffer 176 and activates either sense amplifier 10a or 10b to have the sense amplifier output the data read out of the memory cell array 12a or 12b.

The numeral 13 is a data output buffer via which the data read out of the memory cell array 12a or 12b through the sense amplifier 10a or 10b is output to the outside, and 14 is a data input/output terminal.

The numeral 15 is a data input buffer which latches write data input via the data input/output terminal 14, 16a is a write amplifier for the memory cell array 12a, and 16b is a write amplifier for the memory cell array 12b.

The numeral 17 is a VPP input terminal at which a high voltage VPP for erasure and writing is input, and 18 is a VPP detection circuit for detecting the high voltage VPP input at the VPP input terminal 17.

The numeral 19 is a VCC/VPP switching circuit which outputs a supply voltage VCC as a voltage VPI when no high voltage VPP is detected by the VPP detection circuit 18, and which outputs the high voltage VPP as the voltage VPI when the high voltage VPP is detected by the VPP detection circuit 18.

Figure 26:
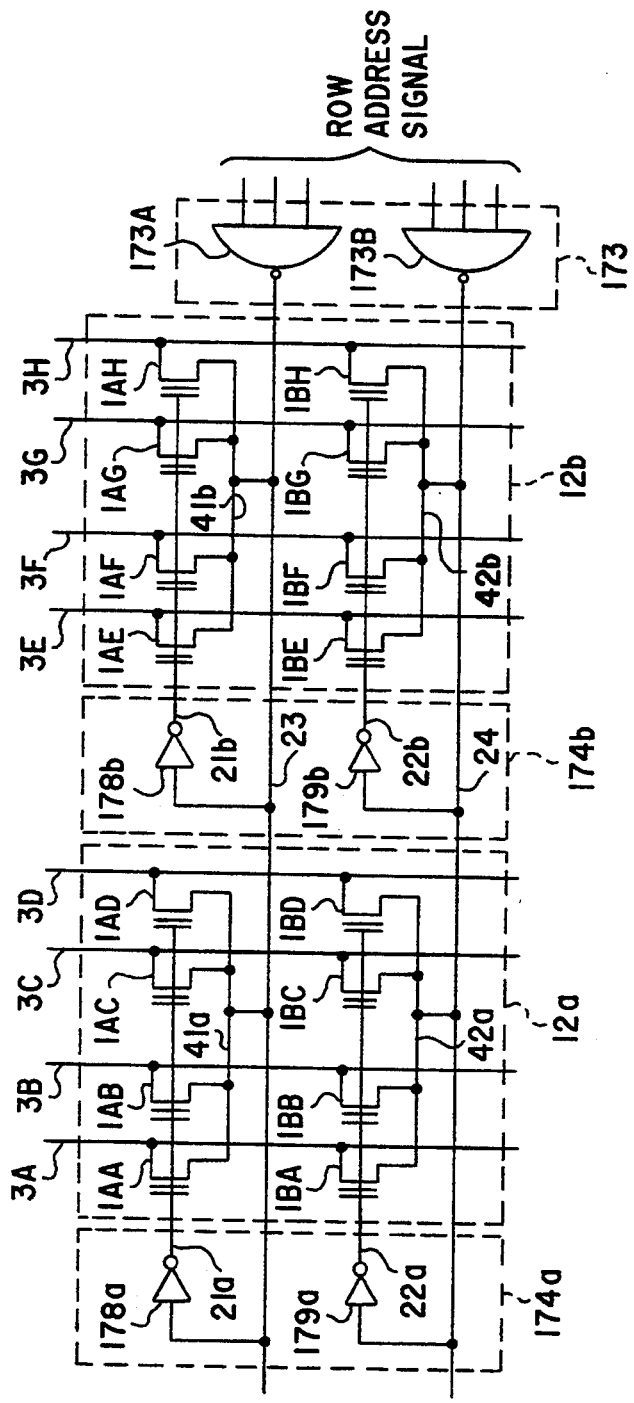
FIG. 26 is a circuit diagram showing portions of memory cell arrays, a main row decoder, and sub row decoders in the eighth embodiment.

FIG. 26 is a circuit diagram showing portions of the memory cell arrays 12a, 12b, main row decoder 173, and sub row decoders 174a and 174b.

In the figure, 1AA to 1BH are memory cell transistors, 21a, 21b, 22a, and 22b are word lines formed from polysilicon, and 3A to 3H are bit lines each formed from a first metal interconnection layer.

The numerals 41a, 41b, 42a, and 42b are source lines each formed from an n-type diffused layer, 23 and 24 are common source lines each formed from a second metal interconnection layer, 173A and 173B are NAND circuits constituting the main row decoder 173, 178a and 179a are inverters constituting the sub row decoder 174a, and 178b and 179b are inverters constituting the sub row decoder 174b.

Figure 27:
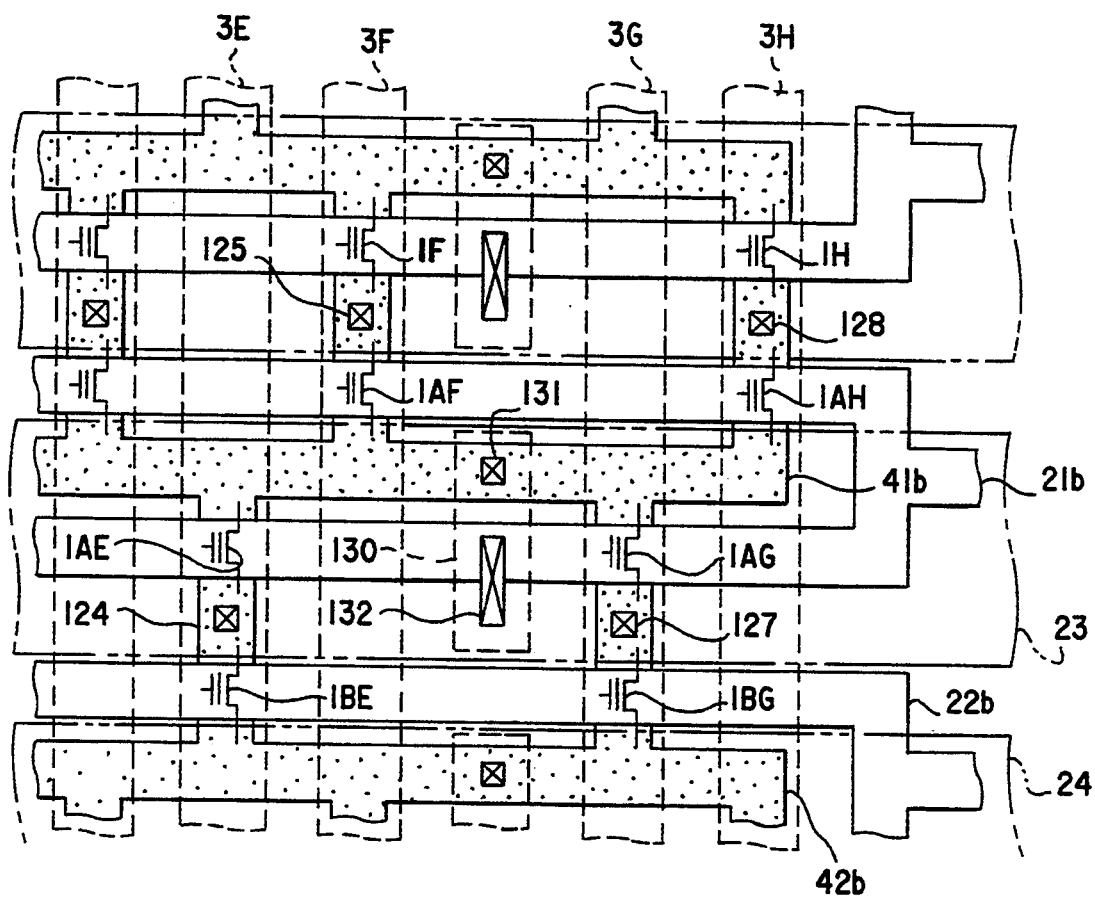
FIG. 27 is a plan view showing a portion of a memory cell array in the eighth embodiment.

FIG. 27 is a schematic top plan view showing a portion of the memory cell array 12b. In the figure, the numeral 124 indicates a contact hole for connecting the drains of the memory cell transistors 1AE and 1BE to the bit line 3E.

Likewise, the numeral 125 indicates a contact hole for connecting the bit line 3F to the drain of the memory cell transistor 1AF and also to the drain of a memory cell transistor 1F located in the same column but one row up from the memory cell transistor 1AF.

Further, the numeral 127 is a contact hole for connecting the drains of the memory cell transistors 1AG and 1BG to the bit line 3G, and 128 is a contact hole for connecting the bit line 3H to the drain of the memory cell transistor 1AH and also to the drain of a memory cell transistor 1H located in the same column but one row up from the memory cell transistor 1AH.

The numeral 130 is a connecting layer, 131 is a contact hole for connecting the source line 41b to the connecting layer 130, and 132 is a contact hole for connecting the connecting layer 130 to the common source line 23.

Referring to FIG. 26, in the eighth embodiment, when the memory cell transistor 1AA is selected to read out the data stored in the memory cell transistor 1AA, the NAND circuit 173A in the main row decoder 173 is made to output 0 V and the NAND circuit 173B made to output 5 V.

As a result, the common source line 23 is driven to 0 V, the common source line 24 to 5 V, the source lines 41a and 41b to 0 V, the source lines 42a and 42b to 5 V, the word lines 21a and 21b to 5 V, and the word lines 22a and 22b to 0 V.

Further, the bit lines 3A and 3E are both driven to 1 V, while the bit lines 3B to 3D and 3F to 3H are set open. At the same time, the sense amplifier 10a is activated and the sense amplifier 10b is deactivated.

For the memory cell transistor 1AA, the drain=1 V, the source=0 V, and the control gate (word line 21a)=5 V; thus, the memory cell transistor 1AA thus being available for reading.

For the memory cell transistor 1BA, on the other hand, the drain=1 V, the source=5 V, and the control gate (word line 22a)=0 V; thus, the memory cell transistor 1BA is put in a deep OFF state.

Therefore, in the deselected memory cell transistor 1BA, leakage current is suppressed even if the memory cell transistor 1BA is in an over-erased state.

Thus, according to the eighth embodiment, with drain=1 V, source=0 V, and control gate=5 V, the selected memory cell transistor is available for reading.

On the other hand, for the deselected memory cell transistors sharing the same bit line with the selected memory cell transistor, the drain=1 V, the source=5 V, and the control gate=0 V, so that each deselected transistor is put in a deep OFF state.

This serves to suppress leakage current in the deselected memory cell transistors sharing the same bit line with the selected memory cell transistor even if any of the deselected transistors is put in an over-erased state.

For example, while writing is being done into the selected memory cell transistor, no current should be allowed to flow into the bit line to which the drain of the selected memory cell transistor is connected. According to the eighth embodiment, no current flows into the bit line since there are no deselected memory cell transistors whose leakage currents affect the bit line.

Thus, according to the eighth embodiment, even when there are over-erased memory cell transistors, the over-erasure is prevented from inducing a failure and data can be read out correctly.

Furthermore, according to the eighth embodiment, the word line selection and driving is performed by the sub-row decoders 174a and 174b that comprise inverters that accept at their inputs a voltage being applied to the common source line selected and driven by the main row decoder 173. This arrangement contributes to simplifying the decoder circuitry and thereby reducing the chip area.

Moreover, according to the eighth embodiment, the number of sub-row decoders can be increased to increase the number of word line divisions and decrease the length of each word line. This improves the risetime of the word line and increases the operating speed.

Figure 28:
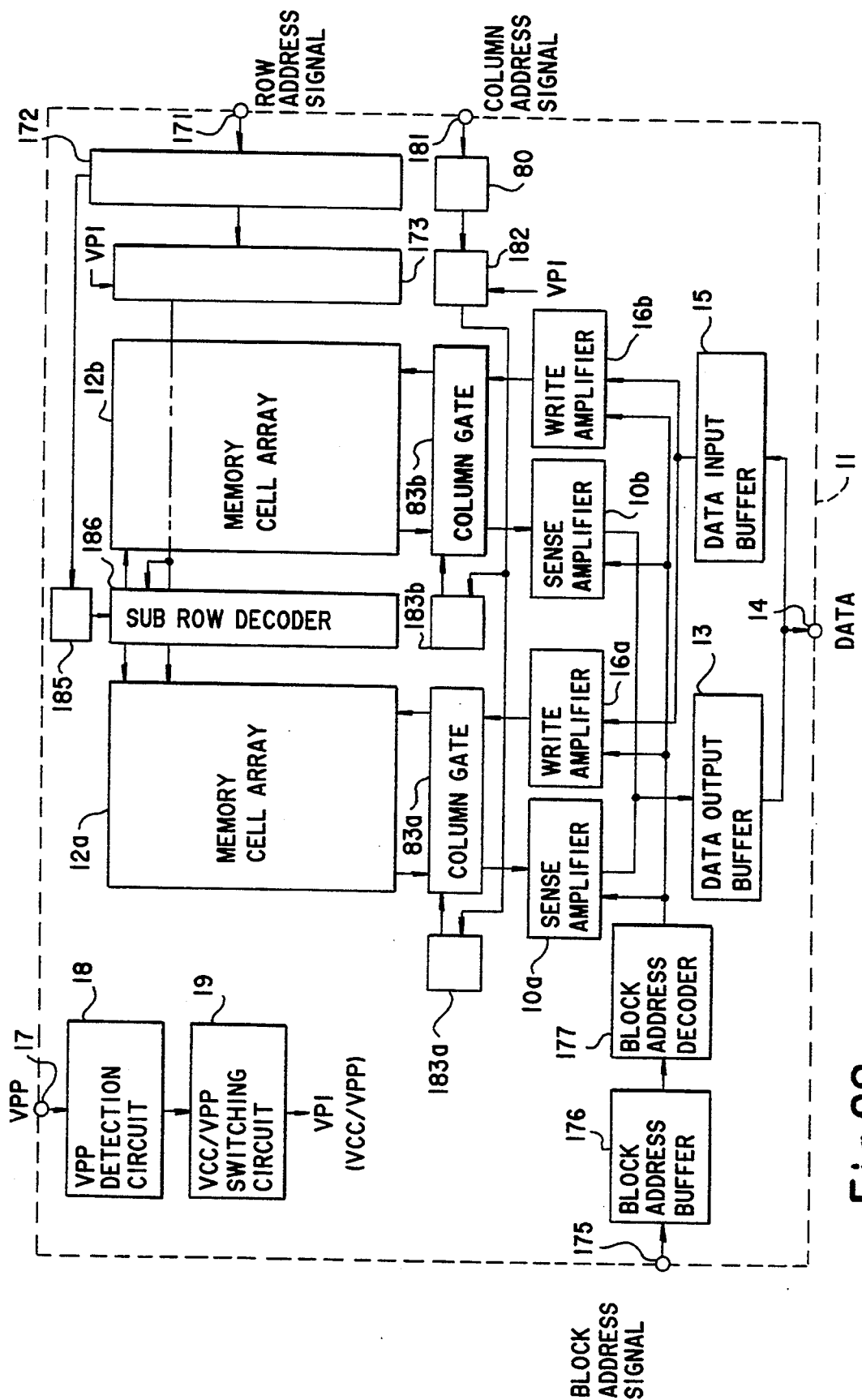
FIG. 28 is a block diagram showing the general configuration of a nonvolatile semiconductor memory according to a ninth embodiment of the present invention.

FIG. 28 is a block diagram showing an essential portion of the ninth embodiment. Only differences from the eighth embodiment will be described below.

In the figure, the numeral 185 designates a predecoder which decodes a portion of an internal row address signal fed from the row address buffer 172 and generates a predecode signal necessary for word line selection.

The numeral 186 indicates a sub-row decoder for selecting a word line in the memory cell array 12a or 12b in accordance with the outputs of the main row decoder 173 and predecoder 175.

Figure 29:
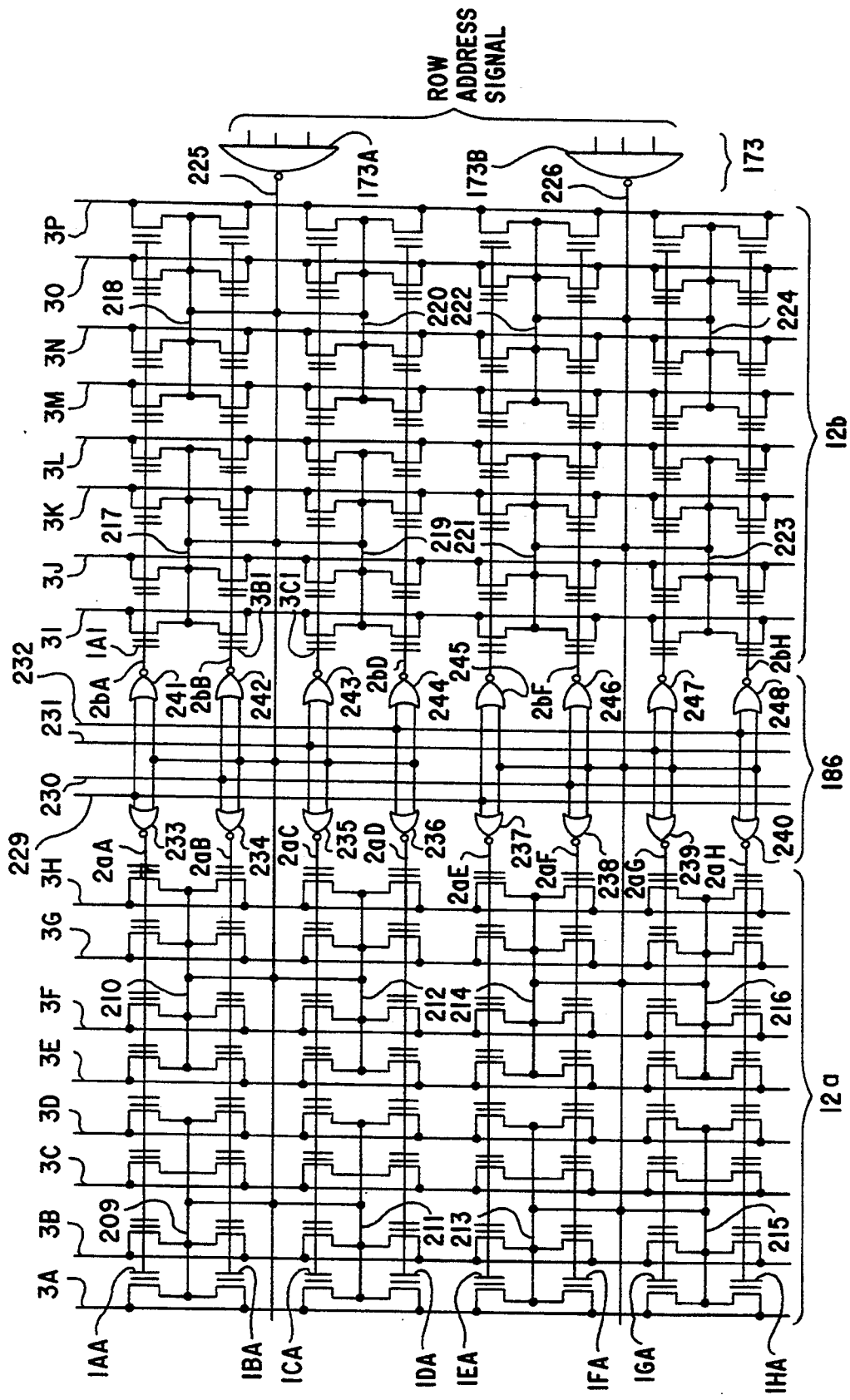
FIG. 29 is a circuit diagram showing portions of memory cell arrays, a main row decoder, and a sub row decoder in the ninth embodiment.

FIG. 29 is a circuit diagram showing portions of the memory cell arrays 12a, 12b, main row decoder 173, and sub row decoder 176.

In the figure, 1AA to 1HI are memory cell transistors, 2aH to 2bH are word lines formed from polysilicon, and 3A to 3P are bit lines each formed from a first metal interconnection layer.

The numerals 209 to 224 are source lines each formed from an n-type diffused layer, 225 and 226 are common source lines each formed from a second metal interconnection layer, and 173A and 173B are NAND circuits constituting the main row decoder 173.

The numerals 229 to 232 are predecode signal lines leading from the predecoder 175, and 233 to 248 are NOR circuits constituting the sub row decoder 186.

In the ninth embodiment, when the memory cell transistor 1AA is selected to read out the data stored in the memory cell transistor 1AA, the NAND circuit 173A in the main row decoder 173 is made to output 0 V and the NAND circuit 173B made to output 5 V.

As a result, the common source line 225 is driven to 0 V, the common source line 226 to 5 V, the source lines 209 to 212 and 217 to 220 to 0 V, and the source lines 213 to 216 and 221 to 224 to 5 V.

Further, the predecoder 185 drives the predecode signal line 229 to 0 V and the predecode signal lines 230 to 232 to 5 V, so that the word lines 2aA and 2bA are driven to 5 V and the word lines 2aB, 2aH, 2bB, and 2bH are driven to 0 V.

On the other hand, the bit lines 3A and 3I are driven to 1 V, while the bit lines 3B and 3H are set open. At the same time, the sense amplifier 10a is activated and the sense amplifier 10b is deactivated.

For the memory cell transistor 1AA, the drain=1 V, the source=0 V, and the control gate (word line 2aA)=5 V, the memory cell transistor 1AA thus being available for reading.

For the memory cell transistors 1BA to 1DA, on the other hand, the drain=1 V, the source=5 V, and the control gate (word lines 2aB to 2aD)=0 V; thus, these memory cell transistors are put in a normal OFF state.

For the memory cell transistors 1EA to 1HA, the drain=1 V, the source=5 V, and the control gate (word lines 2aE to 2aH)=0 V, so that these memory cell transistors are put in a deep OFF state.

As a result, leakage current is suppressed in the memory cell transistors 1EA to 1HA even if these memory cell transistors are in an over-erased state.

Thus, according to the ninth embodiment, for the selected memory cell transistor, the drain is set at 1 V, the source is set at 0 V, and the control gate is set at 5 V, the selected memory cell transistor thus being available for reading.

On the other hand, for the deselected memory cell transistors that share the same bit line and common source line with the selected memory cell transistor, the drain is set at 1 V, the source is set at 0 V, and control gate is set at 0 V, so that these deselected memory cell transistors are put in a normal OFF state.

For the deselected memory cell transistors that share the same bit line but do not share the common source line with the selected memory cell transistor, the drain is set at 1 V, the source is set at 5 V, and the control gate is set at 0 V, so that these deselected memory cell transistors are put in a deep OFF state.

Therefore, if the deselected memory cell transistors that share the same bit line but do not share the common source line with the selected memory cell transistor are in an over-erased state, leakage current is suppressed in these deselected memory cell transistors.

For example, while writing is being done into the selected memory cell transistor, no current should be allowed to flow into the bit line to which the drain of the selected memory cell transistor is connected. In the ninth embodiment, there are no such deselected memory cell transistors whose leakage current affects the bit line, except for the three memory cell transistors that share the common source line with the selected memory cell transistor. If these memory cell transistors are in an over-erased state, the total value of the leakage currents due to these memory cell transistors will not be sufficient to cause a readout failure.

Thus, according to the ninth embodiment, even when there are over-erased memory cell transistors, the over-erasure is prevented from inducing a failure and data can be read out correctly.

Furthermore, according to the ninth embodiment, the main row decoder 173 and the sub row decoder 186 can be formed in a stratified structure, thus allowing a reduction in the chip area.

As described above, according to the second mode of the present invention, during a readout operation the deselected memory cell transistors that share the same bit line with the selected memory cell transistor are put in a deep OFF state; therefore, even if the deselected memory cell transistors that share the same bit line with the selected memory cell transistor are in an over-erased state, their leakage currents can be suppressed. As a result, even when there are over-erased memory cell transistors, the over-erasure is prevented from inducing a failure and data can be read out correctly.

As described, in the electrically erasable nonvolatile semiconductor memory of the present invention, correct data readout can be accomplished even if over-erased cells exist. Accordingly, in the nonvolatile semiconductor memory of the invention, a redundancy configuration that allows a word line replacement can be implemented to improve the production yield.

I claim:

1. A nonvolatile semiconductor memory comprising:
   a plurality of first row lines and a plurality of first column lines arranged in a grid pattern;
   a plurality of second row lines arranged in parallel to said first row lines;
   a plurality of nonvolatile memory elements each arranged at an intersection between said first row lines and said first column lines and having a control electrode connected to one of said first row lines, a first electrode connected to one of said second row lines, and a second electrode connected to one of said first column lines;
   one or more second column lines arranged in parallel to said first column lines; and
   a plurality of active elements each arranged at an intersection between said second column lines and said first row lines and having a control electrode connected to one of said first row lines, a first electrode connected to one of said second column lines, and a second electrode connected to one of said second row lines, wherein for reading, a third voltage is applied to the first row line to which the memory element selected for reading is connected, a first voltage is applied to the remaining first row lines, a second voltage is applied to the first column line to which said selected memory element is connected, and said first voltage is applied to the remaining first column lines as well as to said second column lines, for writing, a fifth voltage is applied to the first row line to which the memory element selected for writing is connected, said first voltage is applied to the remaining first row lines, said first voltage is applied to the first column line to which said selected memory element is connected, a fourth voltage is applied to said second column lines, and the other first column lines than said first column line connected to said selected memory element are opened, and for erasure, a seventh voltage to put said active elements in nonconducting state is applied to said first row lines, and a sixth voltage for erasure is applied to said first column lines.

2. A nonvolatile semiconductor memory according to claim 1, wherein said second electrode of each of said nonvolatile memory elements is provided with such a structure as to provide increased breakdown strength by reducing the impurity concentration gradient thereof.

3. A nonvolatile semiconductor memory according to claim 1, wherein said first electrode of each of said nonvolatile memory elements is provided with such a structure as to enhance hot-carrier generation efficiency by increasing the impurity concentration gradient thereof.

4. A nonvolatile semiconductor memory according to claim 1, wherein said second electrode of each of said nonvolatile memory elements is provided with such a structure as to provide increased breakdown strength by reducing the impurity concentration gradient thereof, and said first electrode thereof is provided with such a structure as to enhance hot-carrier generation efficiency by increasing the impurity concentration gradient thereof.

5. A nonvolatile semiconductor memory according to claim 1, wherein the breakdown strength of said second electrode of each of said nonvolatile memory elements is greater than the breakdown strength of said first electrode.

6. A nonvolatile semiconductor memory according to claim 1, wherein the impurity concentration gradient of said second electrode of each of said nonvolatile memory elements is less steep than the impurity concentration gradient of said first electrode.

7. A nonvolatile semiconductor memory according to claim 1, wherein said sixth voltage can be applied to said first column lines in an individually selective manner for erasure such that erasure takes place for one selected first column line at a time.

8. A nonvolatile semiconductor memory according to claim 1, wherein said sixth voltage can be applied selectively to two or more of said first column lines for erasure so that the nonvolatile memory elements connected to the two or more first column lines to which said sixth voltage is applied are erasable simultaneously.

9. A nonvolatile semiconductor memory according to claim 1, wherein said seventh voltage is a negative voltage and said sixth voltage is identical to said third voltage.

10. A nonvolatile semiconductor memory according to claim 1, wherein during writing an eighth voltage to prevent erroneous writing is applied to the first column lines connected to deselected memory elements.

11. A nonvolatile semiconductor memory according to claim 10, wherein the application of said eighth voltage to the first column lines connected to the deselected memory elements occurs at almost the same time as the application of said fourth voltage to said second column lines.

12. A nonvolatile semiconductor memory according to claim 10, wherein said fifth voltage is applied to said first row line after said fourth voltage and said eighth voltage are respectively applied to said second column lines and said first column lines connected to said deselected memory elements.

13. A nonvolatile semiconductor memory comprising:

a plurality of first row lines and a plurality of first column lines arranged in a grid pattern;

a plurality of second row lines arranged in parallel to said first row lines; and a plurality of nonvolatile memory elements each arranged at an intersection between said first row lines and said first column lines and having a control electrode connected to one of said first row lines, a first electrode connected to one of said second row lines, and a second electrode connected to one of said first column lines, wherein for reading, the first row line, second row line, and first column line to which the nonvolatile memory element selected for reading is connected are supplied with a higher supply voltage, a lower supply voltage, and a positive voltage lower than the higher supply voltage, respectively, while the first row lines and second row lines to which said selected nonvolatile memory element is not connected are supplied with said lower supply voltage and said higher supply voltage, respectively, and the first column lines to which said selected nonvolatile memory element is not connected are opened.

14. A nonvolatile semiconductor memory according to claim 13, wherein said second row lines are provided in corresponding relationship to said first row lines and the potential of each of said second row lines is controllable independently.

15. A nonvolatile semiconductor memory according to claim 14, wherein each of said second row lines is provided with an inverter to which the voltage of said second row line is input and whose output is applied to the corresponding first row line, the supply voltage level for said inverter varying according to the operating mode.

16. A nonvolatile semiconductor memory according to claim 14, wherein each of said first row lines is provided with an inverter to which the voltage of said first row line is input and whose output is applied to the corresponding second row line, the supply voltage level for said inverter varying according to the operating mode.

17. A nonvolatile semiconductor memory according to claim 13, wherein said first row lines are divided into groups of $2^n$ lines, said second row lines form common second row lines each connected to one of said groups of first row lines, and the voltage of each of said common second row lines is controllable independently.

18. A nonvolatile semiconductor memory according to claim 17, wherein each of said first row lines is provided with a NOR gate to which the voltage of said first row line and the voltage of the common second row line associated with the group containing said first row line are input, and whose output is applied to said first row line, the supply voltage level for said NOR gate varying according to the operating mode.

19. A nonvolatile semiconductor memory according to claim 1, further comprising a redundant section which is used to replace defective elements one first row line at a time if a defect is contained in a normal cell matrix consisting of said nonvolatile memory elements.

20. A nonvolatile semiconductor memory according to claim 13, further comprising a redundant section which is used to replace defective elements one first row line at a time if a defect is contained in a normal cell matrix consisting of said nonvolatile memory elements.

* * * * *